(12) United States Patent
Lee et al.

(10) Patent No.: US 12,040,299 B2
(45) Date of Patent: *Jul. 16, 2024

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Sangkyu Lee, Suwon-si (KR); Jingu Kim, Suwon-si (KR); Yongkoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/218,909

(22) Filed: Jul. 6, 2023

(65) Prior Publication Data
US 2023/0352432 A1 Nov. 2, 2023

Related U.S. Application Data

(63) Continuation of application No. 17/337,250, filed on Jun. 2, 2021, now Pat. No. 11,735,553.

(30) Foreign Application Priority Data

Sep. 28, 2020 (KR) .................. 10-2020-0125861

(51) Int. Cl.
*H01L 23/31* (2006.01)
*H01L 23/00* (2006.01)
*H01L 25/065* (2023.01)

(52) U.S. Cl.
CPC .......... *H01L 24/20* (2013.01); *H01L 23/3121* (2013.01); *H01L 24/08* (2013.01); *H01L 24/13* (2013.01); *H01L 24/48* (2013.01); *H01L 25/0657* (2013.01); *H01L 2224/081* (2013.01); *H01L 2224/13024* (2013.01);
(Continued)

(58) Field of Classification Search
CPC ..... H01L 24/20; H01L 23/3121; H01L 24/08; H01L 24/13; H01L 24/48; H01L 25/0657
See application file for complete search history.

(56) References Cited

U.S. PATENT DOCUMENTS 6,114,763 A 9/2000 Smith
6,441,488 B1 8/2002 Smith
(Continued)

*Primary Examiner* — Nathan W Ha
(74) *Attorney, Agent, or Firm* — Muir Patent Law, PLLC

(57) ABSTRACT

A semiconductor package includes a support member, a semiconductor chip arranged in the support member such that a front surface and a backside surface of the semiconductor chip are exposed from a second surface of the support member and a first surface opposite to the second surface respectively, a lower redistribution wiring layer covering the second surface of the support member and including first redistribution wirings electrically connected to chip pads provided at the front surface of the semiconductor chip and vertical connection structures of the support member respectively, and an upper redistribution wiring layer covering the first surface of the support substrate, and including second redistribution wirings electrically connected to the vertical connection structures and a thermal pattern provided on the exposed backside surface of the semiconductor chip.

20 Claims, 51 Drawing Sheets

(52) U.S. Cl.
CPC .................. *H01L 2224/221* (2013.01); *H01L 2224/48227* (2013.01); *H01L 2225/0651* (2013.01)

(56) References Cited

U.S. PATENT DOCUMENTS

| | | | |
|---|---|---|---|
| 8,994,193 B2 | 3/2015 | Tateiwa et al. | |
| 9,048,211 B2 | 6/2015 | Pagaila et al. | |
| 9,107,290 B1 | 8/2015 | Chen | |
| 9,735,087 B2 | 8/2017 | Chang et al. | |
| 9,870,975 B1 | 1/2018 | Wang et al. | |
| 10,347,611 B2 | 7/2019 | Kim et al. | |
| 10,438,899 B2 | 10/2019 | Kim et al. | |
| 10,483,197 B2 | 11/2019 | Jo et al. | |
| 10,861,766 B1* | 12/2020 | Li | H01L 23/3736 |
| 10,867,982 B1* | 12/2020 | Yu | H01L 25/167 |
| 11,735,553 B2* | 8/2023 | Lee | H01L 24/20 |
| | | | 257/774 |
| 2016/0293537 A1 | 10/2016 | Sugiyama et al. | |
| 2019/0131242 A1 | 5/2019 | Lee et al. | |
| 2019/0164893 A1 | 5/2019 | Kim et al. | |
| 2019/0181097 A1 | 6/2019 | Cheah et al. | |
| 2019/0207304 A1 | 7/2019 | Kim et al. | |
| 2019/0229046 A1 | 7/2019 | Tsai et al. | |
| 2019/0371781 A1 | 12/2019 | Huang et al. | |
| 2019/0385929 A1 | 12/2019 | Ku et al. | |
| 2020/0058627 A1 | 2/2020 | Chen et al. | |
| 2020/0105663 A1 | 4/2020 | Tsai et al. | |
| 2020/0126883 A1 | 4/2020 | Wang et al. | |
| 2020/0203301 A1 | 6/2020 | Yu et al. | |
| 2020/0343192 A1 | 10/2020 | Aoki | |
| 2021/0013191 A1 | 1/2021 | Huang et al. | |
| 2021/0098421 A1 | 4/2021 | Wu et al. | |
| 2021/0167016 A1 | 6/2021 | Lu et al. | |
| 2021/0183722 A1 | 6/2021 | Anderson et al. | |
| 2021/0249328 A1 | 8/2021 | Refai-Ahmed et al. | |
| 2021/0280507 A1 | 9/2021 | Aldrete et al. | |
| 2021/0288000 A1 | 9/2021 | Heo | |
| 2021/0305145 A1 | 9/2021 | Huang et al. | |
| 2021/0407920 A1 | 12/2021 | Chen et al. | |
| 2022/0068862 A1 | 3/2022 | Wu et al. | |
| 2022/0070996 A1 | 3/2022 | Esler et al. | |
| 2022/0102305 A1 | 3/2022 | Krishnatreya et al. | |

* cited by examiner

FIG. 25
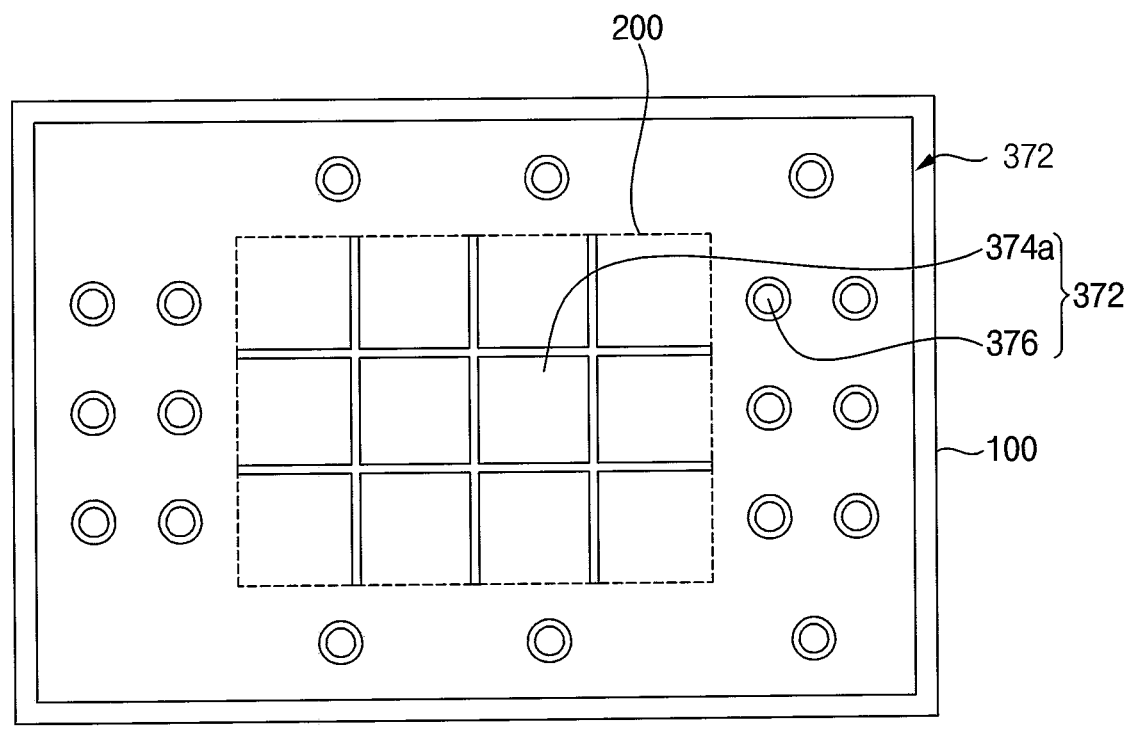
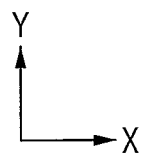

SEMICONDUCTOR PACKAGE AND METHOD OF MANUFACTURING THE SEMICONDUCTOR PACKAGE

PRIORITY STATEMENT

This application is a continuation of U.S. patent application Ser. No. 17/337,250, filed on Jun. 2, 2021, which claims priority under 35 U.S.C. § 119 to Korean Patent Application No. 10-2020-0125861, filed on Sep. 28, 2020 in the Korean Intellectual Property Office (KIPO), the contents of each of which are herein incorporated by reference in their entirety.

BACKGROUND

1. Field

Example embodiments relate to a semiconductor package and a method of manufacturing the semiconductor package, more particularly to, a fan-out semiconductor package and a method of manufacturing the same.

2. Description of the Related Art

A fan out package may include a frame surrounding a semiconductor chip, a front redistribution wiring layer provided on a lower surface of the frame, and a backside redistribution wiring layer on an upper surface of the frame. However, a sealing member such as an epoxy resin may be provided between the semiconductor chip and the backside redistribution wiring layer. Since the sealing member has a relatively low thermal conductivity (about 0.3 W/(m·K)), there is a problem in that the heat dissipation efficiency of dissipating heat from the semiconductor chip to the outside may be deteriorated.

SUMMARY

Example embodiments provide a semiconductor package having excellent heat dissipation efficiency.

Example embodiments provide a method of manufacturing the semiconductor package.

According to example embodiments, a semiconductor package includes a support member, a semiconductor chip arranged in the support member such that a front surface and a backside surface of the semiconductor chip are exposed from a second surface of the support member and a first surface opposite to the second surface respectively, a lower redistribution wiring layer covering the second surface of the support member and the front surface of the semiconductor chip, and including first redistribution wirings electrically connected to chip pads provided at the front surface of the semiconductor chip and vertical connection structures of the support member respectively, and an upper redistribution wiring layer covering the first surface of the support substrate and the backside surface of the semiconductor chip, and including second redistribution wirings electrically connected to the vertical connection structures and a thermal pattern provided on the exposed backside surface of the semiconductor chip.

According to example embodiments, a semiconductor package includes a substrate having a cavity, at least one semiconductor chip arranged within the cavity, and having chip pads provided at a front surface of the semiconductor chip, a sealing layer covering a first surface of the substrate and filling the cavity such that a backside surface of the semiconductor chip is exposed from the sealing layer, a lower redistribution wiring layer covering a second surface of the core substrate opposite to the first surface and including first redistribution wirings electrically connected to the chip pads, an upper redistribution wiring layer covering the first surface of the support substrate and including second redistribution wirings electrically connected to core connection wirings and a thermal pattern provided on the exposed backside surface of the semiconductor chip, and outer connection members arranged on an outer surface of the lower redistribution wiring layer and electrically connected to the first redistribution wirings. The backside surface of the semiconductor chip is coplanar with an upper surface of the sealing layer, and a first thickness of the thermal pattern has a value from 3 μm to 50 μm.

According to example embodiments, a semiconductor package includes a lower redistribution wiring layer including first redistribution wirings stacked in two levels, a semiconductor chip arranged on the lower redistribution wiring layer and having chip pads provided at a front surface to be electrically connected to the first redistribution wirings. a support member on the lower redistribution wiring layer to surround the semiconductor chip and exposing a backside surface of the semiconductor chip, and an upper redistribution wiring layer on the support member and including second redistribution wirings electrically connected to vertical connection structures that penetrate at least a portion of the support member and a thermal pattern provided on the exposed backside surface of the semiconductor chip.

According to example embodiments, a semiconductor package as a fan-out package may include a semiconductor chip in a core substrate, a sealing layer covering an upper surface of the core substrate and exposing a backside surface of the semiconductor chip, and an upper redistribution wiring layer provided on the backside surface of the semiconductor chip and the upper surface of the core substrate. The upper redistribution wiring layer may include redistribution wirings electrically connected to conductive connection structures that penetrate the core substrate and a thermal pattern in thermal contact with the backside surface of the semiconductor chip. The thermal pattern may include a material having a relatively high thermal conductivity such as copper (Cu).

Accordingly, there is no sealing member such as an epoxy resin between the thermal pattern and the backside surface of the semiconductor chip, and the thermal pattern may be in direct thermal contact with the backside surface of the semiconductor chip. Thus, heat from the semiconductor chip may be effectively dissipated to the outside through the upper redistribution wiring layer.

BRIEF DESCRIPTION OF THE DRAWINGS

Example embodiments will be more clearly understood from the following detailed description taken in conjunction with the accompanying drawings. FIGS. 1 to 51 represent non-limiting, example embodiments as described herein.

FIG. 1 is a cross-sectional view illustrating a semiconductor package in accordance with example embodiments.

FIG. 2 is an enlarged cross-sectional view illustrating portion 'A' in FIG. 1.

FIG. 3 is a plan view illustrating first upper redistribution wirings and a thermal pattern of an upper redistribution wiring layer in FIG. 1.

FIGS. 4 to 22 are views illustrating a method of manufacturing a semiconductor package in accordance with example embodiments.

FIG. 23 is a cross-sectional view illustrating a semiconductor package in accordance with example embodiments.

FIG. 24 is an enlarged cross-sectional view illustrating portion 13' in FIG. 23.

FIG. 25 is a plan view illustrating first upper redistribution wirings and a thermal pattern of an upper redistribution wiring layer in FIG. 23.

FIGS. 26 to 31 are cross-sectional views illustrating a method of manufacturing a semiconductor package in accordance with example embodiments.

FIG. 32 is a cross-sectional view illustrating a semiconductor package in accordance with example embodiments.

FIG. 33 is an enlarged cross-sectional view illustrating portion 'C' in FIG. 32.

FIGS. 34 to 39 are cross-sectional views illustrating a method of manufacturing a semiconductor package in accordance with example embodiments.

FIG. 40 is a cross-sectional view illustrating a semiconductor package in accordance with example embodiments.

FIG. 41 is a cross-sectional view illustrating a semiconductor package in accordance with example embodiments.

FIGS. 42 to 51 are cross-sectional views illustrating a method of manufacturing a semiconductor package in accordance with example embodiments.

DETAILED DESCRIPTION OF EXAMPLE EMBODIMENTS

Hereinafter, example embodiments will be explained in detail with reference to the accompanying drawings.

Figure 1:
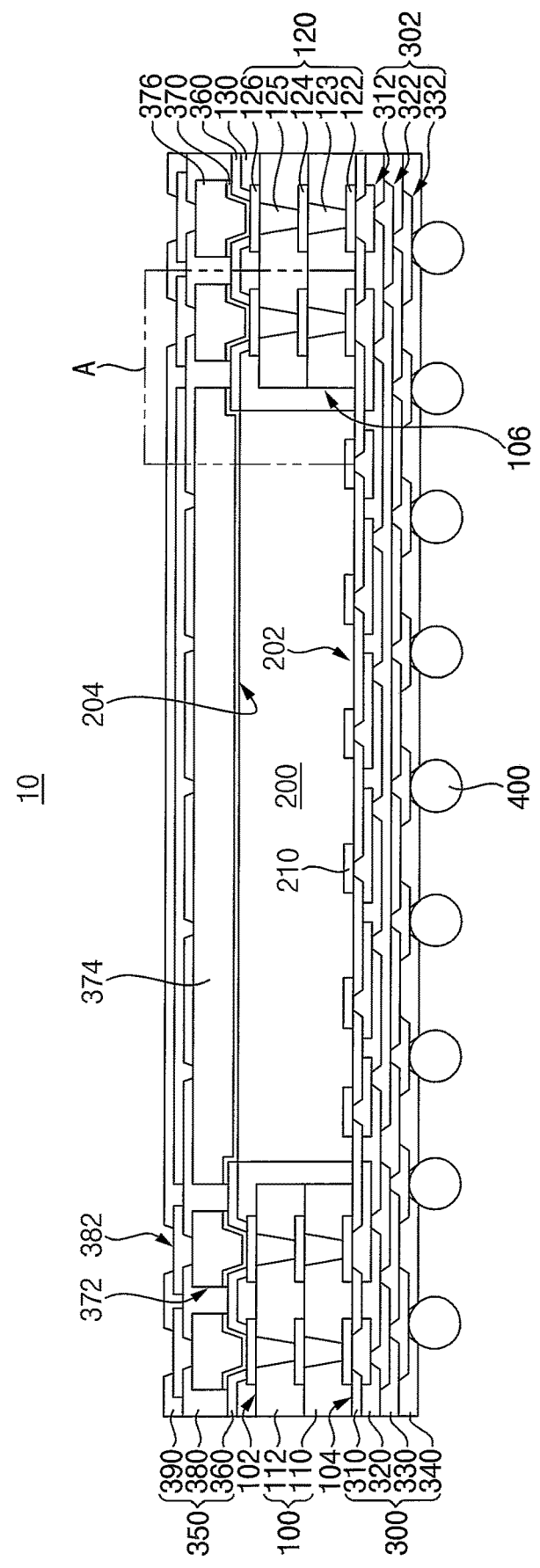
Figure 2:
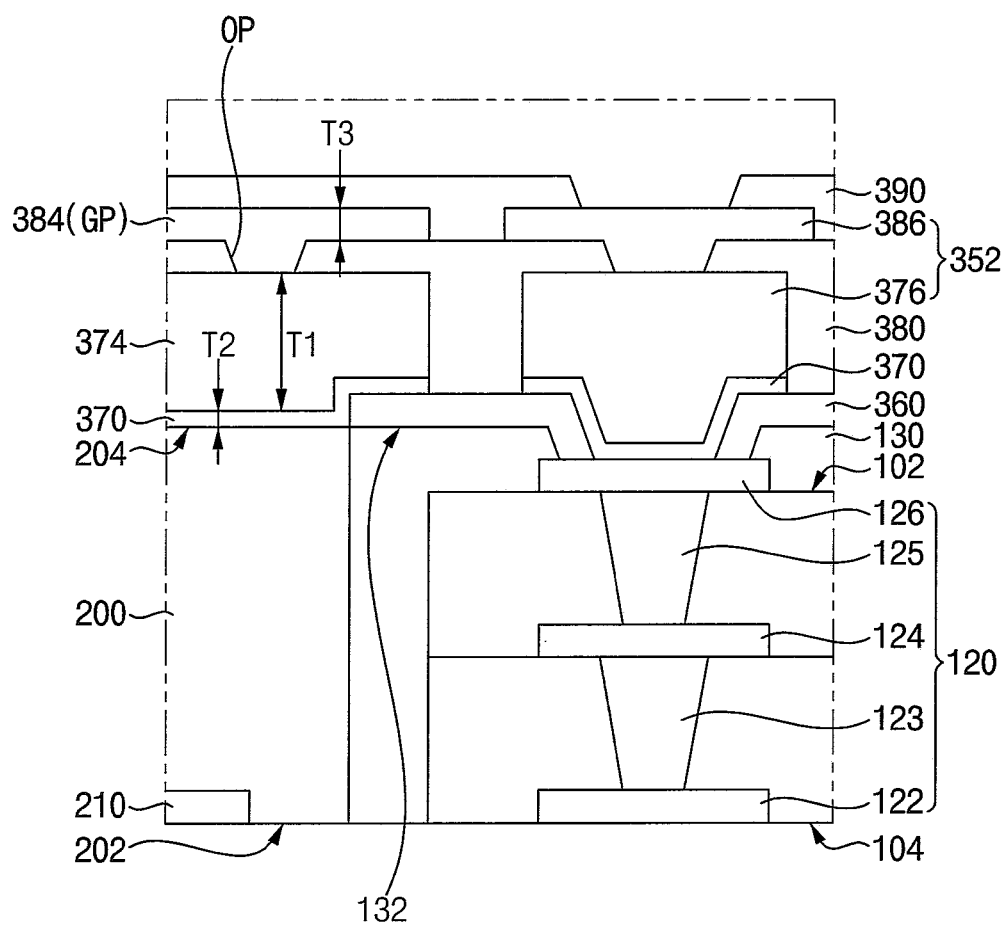
Figure 3:
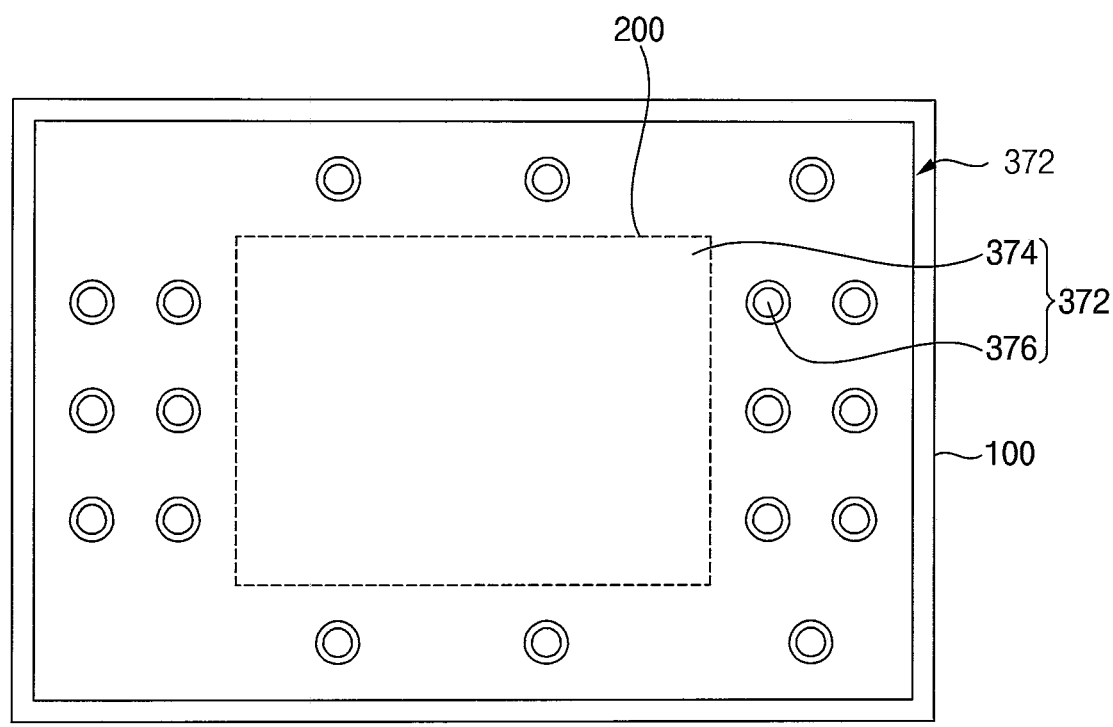

FIG. 1 is a cross-sectional view illustrating a semiconductor package in accordance with example embodiments. FIG. 2 is an enlarged cross-sectional view illustrating portion 'A' in FIG. 1. FIG. 3 is a plan view illustrating first upper redistribution wirings and a thermal pattern of an upper redistribution wiring layer in FIG. 1.

Referring to FIGS. 1 to 3, a semiconductor package 10 may include a core substrate 100, at least one semiconductor chip 200 provided in the core substrate 100, a lower redistribution wiring layer 300 provided on a lower surface 104 of the core substrate 100, and an upper redistribution wiring layer 350 provided on an upper surface 102 of the core substrate 100. The semiconductor package 10 may further include outer connection members 400 provided on an outer surface of the lower redistribution wiring layer 300.

In example embodiments, the semiconductor package 10 may include the core substrate 100 provided as a support member which surrounds the semiconductor chip 200 and supports the redistribution wiring layer in a fan out region. The core substrate 100 may serve as a frame surrounding the semiconductor chip 200. The core substrate 100 may include core connection wirings 120 which are provided in the fan out region outside an area where the semiconductor chip 200 is arranged. The core connection wirings 120 may serve to function as an electrical connection path with the semiconductor chip 200. Accordingly, the semiconductor package 10 may be provided as a fan-out package. The semiconductor package 10 may be provided as a unit package on which a second package is stacked.

Further, the semiconductor package 10 may be provided as a System-In-Package (SIP). For example, one or more semiconductor chip may be arranged in the core substrate 100. The semiconductor chip may include a logic chip including logic circuits and/or a memory chip. The logic chip may be a controller to control the memory chip. The memory chip may include various memory circuits such as dynamic random access memory (DRAM), static random access memory (SRAM), flash, phase-change random access memory (PRAM), resistive random access memory (ReRAM), ferroelectric random access memory (FeRAM), magnetic random access memory (MRAM), or the like.

In example embodiments, the core substrate 100 may have a first surface (upper surface) 102 and a second surface (lower surface) 104 opposite to each other. The core substrate 100 may have a cavity 106 in the middle region thereof. The cavity 106 may extend from the first surface 102 to the second surface 104 of the core substrate 100.

The core substrate 100 may include a plurality of stacked insulation layers 110, 112 and the core connection wirings 120 provided in the insulation layers. A plurality of the core connection wirings 120 may be provided in the fan out region outside an area where the semiconductor chip (die) is disposed, to be used for electrical connection with the semiconductor chip mounted therein. The core connection wiring 120 may be a vertical connection structure penetrating the core substrate 100 from the first surface 102 to the second surface 104 of the core substrate 100.

For example, the core substrate 100 may include a first insulation layer 110 and a second insulation layer 112 stacked on the first insulation layer 110. The core connection wiring 120 may include a first metal wiring 122, a first contact 123, a second metal wiring 124c, a second contact 125 and a third metal wiring 126. The first metal wiring 122 may be provided in the second surface 104 of the core substrate 100, that is, a lower surface of the first insulation layer 110, and at least a portion of the first metal wiring 122 may be exposed from the second surface 104. The third metal wiring 126 may be provided in the first surface 102 of the core substrate 100, that is, an upper surface of the second insulation layer 112, and at least a portion of the third metal wiring 126 may be exposed from the first surface 102. It may be understood that the numbers and arrangements of the insulation layers and the core connection wirings of the core substrate 100 may not be limited thereto.

In example embodiments, the semiconductor chip 200 may be disposed within the cavity 106 of the core substrate 100. A sidewall of the semiconductor chip 200 may be spaced apart from an inner sidewall of the cavity 106. Accordingly, a gap may be formed between the sidewall of the semiconductor chip 200 and the inner sidewall of the cavity 106.

The semiconductor chip 200 may include a substrate and chip pads 210 on an active surface, for example, a front surface 202 of the substrate. In an embodiment, transistors of the semiconductor chip 200 may be formed in a region adjacent to the active surface of the substrate. The semiconductor chip 200 may be arranged such that the front surface 202 on which the chip pads 210 of the semiconductor chip 200 are formed faces downward. Accordingly, the chip pads 210 may be exposed from the second surface 104 of the core substrate 100. The front surface 202 of the semiconductor chip 200 may be coplanar with the second surface 104 of the core substrate 100. A backside surface 204 opposite to the front surface 202 of the semiconductor chip 200 may be positioned higher than the first surface 102 of the core substrate 100. A thickness of the semiconductor chip 200 may be greater than a thickness of the core substrate 100. The thickness of the semiconductor chip 200 may have a value from 60 µm to 150 µm, and the thickness of the core substrate 100 may have a value from 50 µm to 130 µm.

In example embodiments, a sealing layer 130 may be provided on the first surface 102 of the core substrate 100 to fill the cavity 106 and expose the backside surface 204 of the semiconductor chip 200. The sealing layer 130 may have openings that expose the third metal wirings 126 of the core connection wirings 120. The backside surface 204 of the semiconductor chip 200 may be coplanar with an upper surface 132 of the sealing layer 130.

The sealing layer 130 may be formed to fill the gap between the sidewall of the semiconductor chip 200 and the inner sidewall of the cavity 106. Accordingly, the sealing layer 130 may cover the sidewall of the semiconductor chip 200, the first surface 102 of the core substrate 100 and the inner sidewall of the cavity 106.

For example, the sealing layer 130 may include a thermosetting resin such as epoxy resin, a thermoplastic resin such as polyimide, a resin including reinforcing materials such as inorganic fillers, etc. For example, the sealing layer 130 may include an insulation film such as ABF (Ajinomoto Build-up Film), a composite material such as FR-4, a resin such as BT (Bismaleimide Triazine), etc. The sealing layer 130 may include a molding material such as Epoxy Molding Compound (EMC), a photosensitive insulating material such as PIE (Photo Imageable Encapsulant), etc.

In example embodiments, the lower redistribution wiring layer 300 may be arranged on the second surface 104 of the core substrate 100 and the front surface of the semiconductor chip 200. The lower redistribution wiring layer 300 may include first redistribution wirings 302 electrically connected to the chip pads 210 of the semiconductor chip 200 and the core connection wirings 120. The first redistribution wirings 302 may be provided on the front surface 202 of the semiconductor chip 200 and the second surface 104 of the core substrate 100 to function as a front side redistribution wiring. Accordingly, the lower redistribution wiring layer 300 may be a front redistribution wiring layer of a fan out package.

For example, the lower redistribution wiring layer 300 may include a first lower redistribution wiring layer provided on a first lower insulation layer 310 and having first lower redistribution wirings 312.

The first lower insulation layer 310 may be provided on the second surface 104 of the core substrate 100 and may have first openings that expose the chip pads 210 of the semiconductor chip 200 and the first metal wirings 122 of the core connection wirings 120, respectively. The first lower redistribution wirings 312 may be provided on the first lower insulation layer 310, and portions of the first lower redistribution wirings 312 may contact the chip pads 210 and the first metal wirings 122 through the first openings, respectively. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The lower redistribution wiring layer 300 may include a second lower redistribution wiring layer provided on a second lower insulation layer 320 and having second lower redistribution wirings 322.

The second lower insulation layer 320 may be provided on the first lower insulation layer 310 and may have second openings that expose the first lower redistribution wirings 312, respectively. The second lower redistribution wirings 322 may be provided on the second lower insulation layer 320, and portions of the second lower redistribution wirings 322 may contact the first lower redistribution wirings 312 through the second openings, respectively.

The lower redistribution wiring layer 300 may include a third lower redistribution wiring layer provided on a third lower insulation layer 330 and having third lower redistribution wirings 332.

The third lower insulation layer 330 may be provided on the second lower insulation layer 320 and may have third openings that expose the second lower redistribution wirings 322, respectively. The third lower redistribution wirings 332 may be provided on the third lower insulation layer 330 and portions of the third lower redistribution wirings 332 may contact the second lower redistribution wirings 322 through the third openings, respectively.

The lower redistribution wiring layer 300 may include a fourth lower insulation layer 340 provided on the third lower insulation layer 330 to expose portions of the third lower redistribution wirings 332. The fourth lower insulation layer 340 may serve as a passivation layer. A bump pad (not illustrated) such as UBM (Under Bump Metallurgy) may be provided on the portion of the third lower redistribution wiring 332 exposed by the fourth lower insulation layer 340. The exposed portion of the third lower redistribution wiring 332 may serve as a landing pad, that is, a package pad.

For example, the first to third lower insulation layers may include a polymer layer, a dielectric layer, etc. The first to third lower redistribution wirings may include aluminum (Al), copper (Cu), tin (Sn), nickel (Ni), gold (Au), platinum (Pt) or an alloy thereof. A thickness of each of the first to third lower redistribution wirings may have a value from 3 µm to 8 µm.

Accordingly, the lower redistribution wiring layer 300 may be provided on the front surface 202 of the semiconductor chip 200 and the second surface 104 of the core substrate 100 and may include the first redistribution wirings 302 electrically connected to the chip pads 210 and the core connection wirings 120, respectively. The lower redistribution wiring layer 300 may cover the second surface 104 of the core substrate 100 provided in an area (fan out region) outside the semiconductor chip 200. Some of the first redistribution wirings 302 may electrically connect the chip pads 210 of the semiconductor chip 200 and the core connection wirings 120 of the core substrate 100. It may be understood that the number, sizes, arrangements, etc. of the lower insulation layers and the lower redistribution wirings of the lower redistribution wiring layer are exemplarily illustrated, and thus, it may not be limited thereto.

In example embodiments, the upper redistribution wiring layer 350 may be provided on the first surface 102 of the core substrate 100 and the backside surface 204 of the semiconductor chip 200 and may include second redistribution wirings 352 electrically connected to the core connection wirings 120. The second redistribution wirings 352 may be provided on the backside surface 204 of the semiconductor chip 200 and the first surface 102 of the core substrate 100 to function as a backside redistribution wiring. Accordingly, the upper redistribution wiring layer 350 may be a backside redistribution wiring layer of a fan out package.

The upper redistribution wiring layer 350 may include first and second upper metal patterns 372, 382 stacked in two levels. The first upper metal pattern 372 may include a thermal pattern 374 and a first upper redistribution wiring 376. The second upper metal pattern 382 may include a metal pattern 384 and a second upper redistribution wiring 386. The second redistribution wirings 352 may include the first and second upper redistribution wirings 376, 386 stacked in two levels.

For example, the upper redistribution wiring layer 350 may include a first upper redistribution wiring layer having the thermal pattern 374 arranged on the backside surface 204 of the semiconductor chip 200 and the first upper redistribution wiring 376 electrically connected to the core connection wiring 120.

The upper redistribution wiring layer 350 may further include a seed layer 370 as a barrier layer provided between the thermal pattern 374 and the backside surface 204 of the semiconductor chip 200. The thermal pattern 374 and the first upper redistribution wiring 376 may be formed by a plating process using the seed layer 370. The thermal pattern 374 may be provided to cover the entire backside surface 204 of the semiconductor chip 200. Because the thermal pattern 374 and the first upper redistribution wiring 376 are formed together by the plating process, the thermal pattern 374 may be located on the same plane as the first upper redistribution wiring 376.

For example, the thermal pattern 374 and the first upper redistribution wiring 376 may include or may be formed of copper (Cu), silver (Ag), gold (Au), nickel (Ni), platinum (Pt), aluminum (Al), etc., or combinations thereof A thickness T1 of the thermal pattern 374 may have a value from 3 μm to 50 μm.

The seed layer 370 may include an alloy layer including titanium/copper (Ti/Cu), titanium/palladium (Ti/Pd), titanium/nickel (Ti/Ni), chrome/copper (Cr/Cu) or a combination thereof. A thickness T2 of the seed layer 370 may have a value from 0.1 μm to 0.5 μm.

When the seed layer 370 includes titanium (Ti), the seed layer 370 may have a relatively high adhesive strength (0.5 kgf/cm$^2$ or more) with silicon. Accordingly, the seed layer 370 may serve as an adhesive layer that attaches the thermal pattern 374 to the backside surface 204 of the semiconductor chip 200. For example, the adhesive layer may be a thermally conductive adhesive paste or film such as a die attach film (DAF).

As illustrated in FIG. 3, the semiconductor package 10 including the core substrate 100 may have a rectangle shape, when the semiconductor package 10 is viewed in a plan view. The thermal pattern 374 may have a planar area corresponding to the backside surface 204 of the semiconductor chip 200. For example, the thermal pattern 374 may have an area of at least 80% of a package area.

When the thermal pattern 374 includes or is formed of copper (Cu), since a thermal conductivity of copper (Cu) is 401 W/(m·K), the thermal pattern 374 may be in direct thermal contact with the backside surface 204 of the semiconductor chip 200 to effectively dissipate heat from the semiconductor chip 200. For example, the thermal pattern 374 may contact the backside surface 204 of the semiconductor chip 200 with or without a thermal conductive adhesive paste or film therebetween.

The thermal pattern 374 may include a ground pattern. The first upper redistribution wiring 376 may include a signal pattern. The first upper metal pattern 372 may include a ground pattern arranged around the signal pattern in the fan out region. The ground pattern may include a metal pattern having a plurality of through holes. The through hole may have a cylindrical or polygonal column shape. The through hole may serve to discharge a gas in the insulation film in a package process such as a curing process.

In example embodiments, the upper redistribution wiring layer 350 may further include a protective layer pattern 360 provided on the upper surface 132 of the sealing layer 130. The protective layer pattern 360 may have openings that expose the backside surface 204 of the semiconductor chip 200 and the third metal wirings 26 of the core connection wirings 120.

For example, the protective layer pattern 360 may an insulation material such as PID (Photo Imageable Dielectric). Because the protective layer pattern 360 covers the upper surface 132 of the sealing layer 130, fillers within the sealing layer 130 may be prevented from escaping from the sealing layer 130 including an insulation film such as ABF (Ajinomoto Build-up Film) during a sputtering process for forming the seed layer.

The upper redistribution wiring layer 350 may include a first upper insulation layer 380 covering the first upper redistribution wiring layer, and a second upper redistribution wiring layer on the first upper insulation layer 380 and having the metal pattern 384 arranged on the thermal pattern 374 and the second upper redistribution wirings 386 electrically connected to the first upper redistribution wiring 376. The metal pattern 384 may include a ground pattern GP electrically connected to the thermal pattern 374. The ground pattern GP of the metal pattern 384 may contact portions of the thermal pattern 374 through a plurality of openings OP formed in the first upper insulation layer 380. The openings OP may penetrate the first upper insulation layer 380 to expose the thermal pattern 374. The thermal pattern 374 may be disposed between the metal pattern 384 and the backside surface 204 of the semiconductor chip 200 or between the ground pattern 384 and the backside surface 204 of the semiconductor chip 200.

For example, the metal pattern and the second upper redistribution wiring may include copper (Cu), silver (Ag), gold (Au), nickel (Ni), platinum (Pt), aluminum (Al), etc. A thickness of each of the metal pattern 384 and the second upper redistribution wiring 386 may have a value from 3 μm to 8 μm. The thicknesses of the metal pattern 384 and the second upper redistribution wiring 386 may be the same as the thickness of each of the lower redistribution wirings 312, 322, 332. The present inventive concept is not limited thereto. For example, the thicknesses of the metal pattern 384 and the second upper redistribution wiring 386 may be different from the thickness of each of the lower redistribution wirings 312, 322, 332.

The upper redistribution wiring layer 350 may include a second upper insulation layer 390 provided on the first upper insulation layer 380 to expose portions of the second upper redistribution wirings 386. The second upper insulation layer 390 may serve as a passivation layer. A bump pad (not illustrated) such as UBM (Under Bump Metallurgy) may be provided on the portion of the second upper redistribution wiring 386 exposed by the second upper insulation layer 390. The exposed portion of the second upper redistribution wiring 386 may serve as a landing pad, that is, a package pad.

The first and second insulation layers may include an insulation material such as epoxy resin (thermoset dielectric material), a photo imageable dielectric (PID) material, an insulation film such as ABF (Ajinomoto Build-up Film), etc.

In example embodiments, the outer connection members 400 may be provided on the package pads on the outer surface of the lower redistribution wiring layer 300, respectively. For example, the outer connection member 400 may include a solder ball. The solder ball may have a diameter of 300 μm to 500 μm. The semiconductor package 10 may be mounted on a module substrate (not illustrated) via the solder balls to constitute a memory module.

As mentioned above, the semiconductor package 10 as the fan-out panel level package may include the upper redistribution wiring layer 350 provided on the backside surface 204 of the semiconductor chip 200 exposed by the core substrate 100 and the sealing layer 130, and provided on the first surface 102 of the core substrate 100. The upper redistribution wiring layer 350 may include the thermal pattern 374 in thermal contact with the backside surface 204 of the semiconductor chip 200. For example, the thermal pattern 374 may contact the backside surface 204 of the semiconductor chip 200 with or without a thermal conductive adhesive paste or film therebetween. The thermal pattern 374 may include a material having a relatively high thermal conductivity such as copper (Cu).

Accordingly, there is no sealing member such as an epoxy resin between the thermal pattern 374 and the backside surface 204 of the semiconductor chip 200, and the thermal pattern 374 may be in direct thermal contact with the backside surface 204 of the semiconductor chip 200. Thus, heat from the semiconductor chip 200 may be effectively dissipated to the outside through the upper redistribution wiring layer 350.

Hereinafter, a method of manufacturing the semiconductor package in FIG. 1 will be explained.

Figure 4:
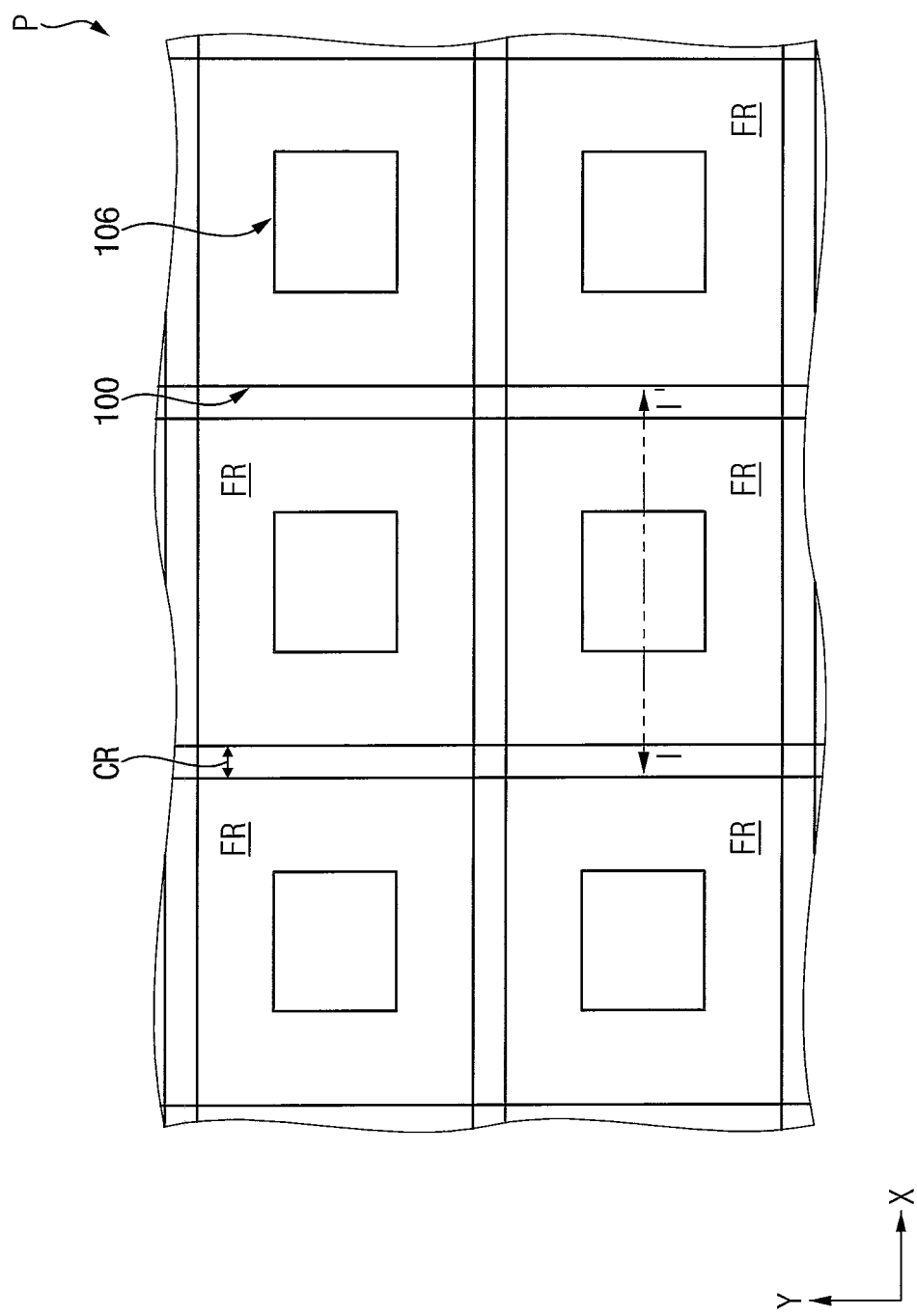

FIGS. 4 to 22 are views illustrating a method of manufacturing a semiconductor package in accordance with example embodiments. FIG. 4 is a plan view illustrating a panel having a plurality of core substrates formed therein. FIGS. 5 to 22 are cross-sectional views taken along the line I-I' in FIG. 4.

Referring to FIGS. 4 to 7, first, a panel P having a plurality of core substrates 100 formed therein may be prepared, a semiconductor chip 200 may be arranged in a cavity of the core substrate 100, and then, a sealing layer 130 may be formed to cover the semiconductor chip 200.

In example embodiments, the core substrate 100 may be used as a support frame for electrical connection for manufacturing a semiconductor package having a fan-out panel level package configuration.

As illustrated in FIG. 4, the panel P may include a frame region FR on which the core substrate 100 is formed and a scribe lane region, that is, cutting region CA surrounding the frame region FR. As described later, the panel P may be sawed along the cutting region CA dividing the frame regions FR to form an individual core substrate 100.

The core substrate 100 may have a first surface 102 and a second surface 104 opposite to each other. The core substrate 100 may have the cavity 106 in a middle region of the frame region FR. As described later, the cavity 106 may have an area for receiving at least one semiconductor chip.

The core substrate 100 may include a plurality of stacked insulation layers 110, 112 and core connection wirings 120 provided in the insulation layers. A plurality of the core connection wirings 120 may be provided to penetrate through the core substrate 100 from the first surface 102 to the second surface 104 of the core substrate 100 to function as an electrical connection path. For example, the core connection wirings 120 may be provided in a fan out region outside an area where the semiconductor chip (die) is disposed to be used for electrical connection. For example, the core connection wiring 120 may include a first metal wiring 122, a first contact 123, a second metal wiring 124c, a second contact 125 and a third metal wiring 126.

Figure 5:
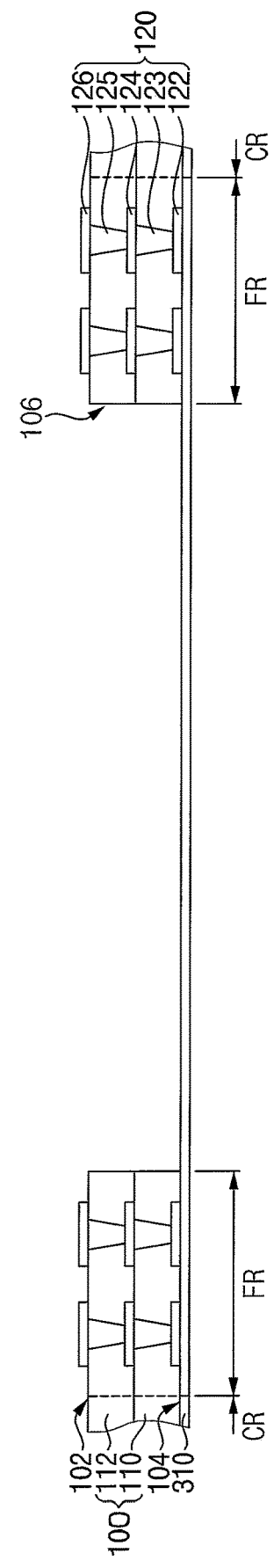
Figure 6:
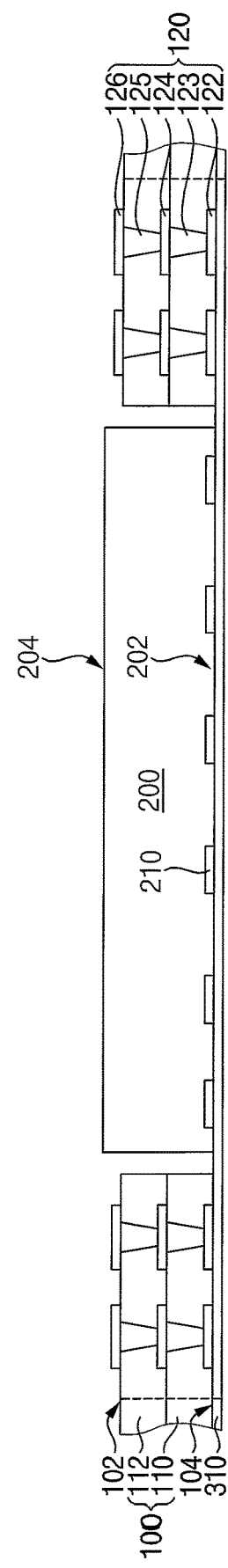

As illustrated in FIGS. 5 and 6, the panel P may be arranged on a barrier tape 20, and then the at least one semiconductor chip 200 may be arranged within the cavity 106.

The second surface 104 of the core substrate 100 may be adhered on the barrier tape 20. For example, about 200 to about 6,000 dies (chips) may be arranged in the cavities 106 of the panel P, respectively. As described later, a singulation process may be performed to saw the panel P to complete a fan-out panel level package. Alternatively, a plurality of semiconductor chips 200 may be arranged within one cavity 106. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The semiconductor chip 200 may include a substrate and chip pads 210 on an active surface, which is a front surface 202 of the substrate. In an embodiment, transistors of the semiconductor chip 200 may be formed in a region adjacent to the active surface of the substrate. The semiconductor chip 200 may be arranged such that the front surface on which the chip pads 210 are formed faces downward the barrier tape 20. The front surface 202 of the semiconductor chip 200 may be coplanar with the second surface 104 of the core substrate 100.

The semiconductor chip 200 may be disposed within the cavity 106 of the core substrate 100. A sidewall of the semiconductor chip 200 may be spaced apart from an inner sidewall of the cavity 106. Accordingly, a gap may be formed between the sidewall of the semiconductor chip 200 and the inner sidewall of the cavity 106.

A thickness of the semiconductor chip 200 may be greater than a thickness of the core substrate 100. Accordingly, a backside surface 204 of the semiconductor chip 200 may be positioned higher than the first surface 102 of the core substrate 100.

Figure 7:
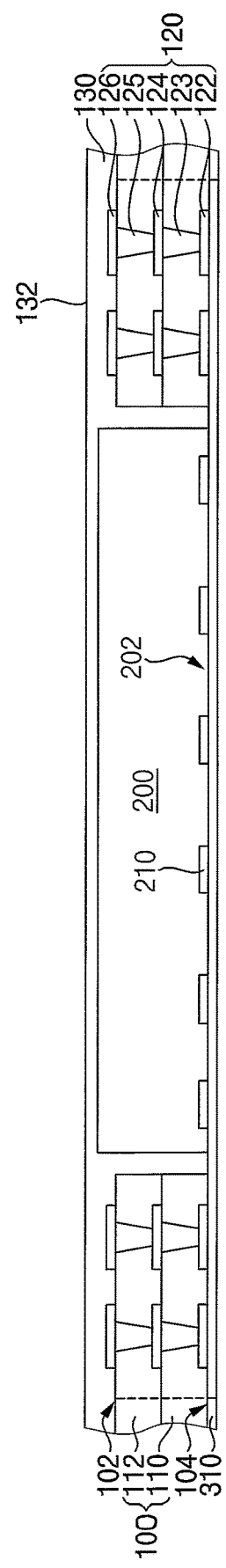

As illustrated in FIG. 7, the sealing layer 130 may be formed on the first surface 102 of the core substrate 100 to cover the semiconductor chip 200. The sealing layer 130 may be formed to fill the gap between the sidewall of the semiconductor chip 200 and the inner sidewall of the cavity 106. Accordingly, the sealing layer 130 may cover the backside surface 204 of the semiconductor chip 200, the first surface 102 of the core substrate 100 and the inner sidewall of the cavity 106.

For example, the sealing layer 130 may include a thermosetting resin such as epoxy resin, a thermoplastic resin such as polyimide, a resin including reinforcing materials such as inorganic fillers, etc. For example, the sealing layer may include an insulation film such as ABF (Ajinomoto Build-up Film), a composite material such as FR-4, a resin such as BT (Bismaleimide Triazine), etc. The sealing layer may include a molding material such as Epoxy Molding Compound (EMC), a photosensitive insulating material such as PIE (Photo Imageable Encapsulant), etc. When the sealing layer 130 includes an insulating film such as ABF, the sealing layer 130 may be formed by a lamination process.

Figure 8:
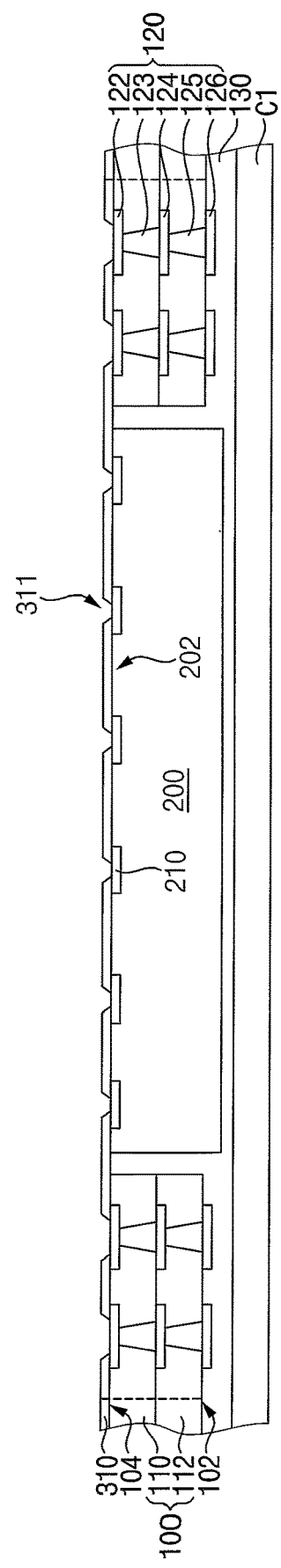
Figure 9:
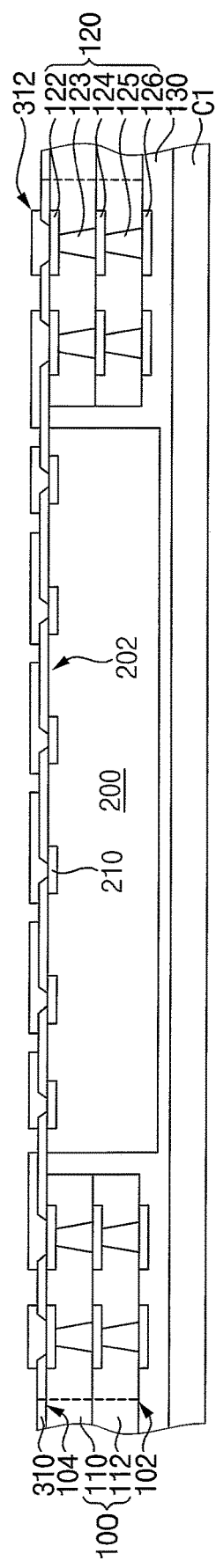
Figure 10:
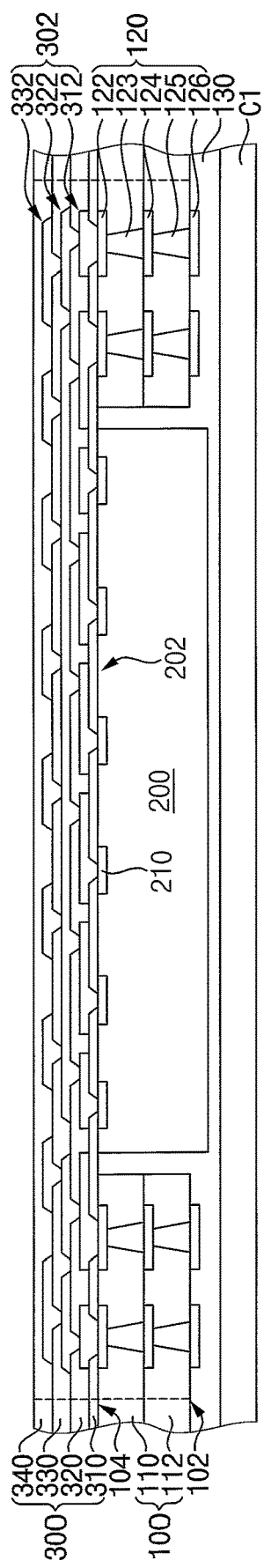

Referring to FIGS. 8 to 10, the structure in FIG. 7 may be reversed, and then, a lower redistribution wiring layer 300 may be formed on the second surface 104 of the core substrate 100 and the front surface 202 of the semiconductor chip 200. The lower redistribution wiring layer 300 including first redistribution wirings 302 electrically connected to the chip pads 210 of the semiconductor chip 200 and the core connection wirings 120 respectively may be formed on the second surface 104 of the core substrate 100 and the front surface 202 of the semiconductor chip 200. The lower redistribution wiring layer 300 may be a front redistribution wiring layer of a fan out package.

As illustrated in FIG. 8, after removing the barrier tape 20, the structure in FIG. 7 may be reversed, and the sealing layer 130 may be adhered on a first carrier substrate C1. Then, a first lower insulation layer 310 may be formed on the second surface 104 of the core substrate 100 and the front surface 202 of the semiconductor chip 200, and then, the first lower insulation layer 310 may be patterned to form first openings 311 that expose the chip pads 210 of the semiconductor chip 200 and the first metal wirings 122 of the core connection wiring 120, respectively.

For example, the first lower insulation layer 310 may include a polymer layer, a dielectric layer, etc. The first lower insulation layer may be formed by a vapor deposition process, a spin coating process, etc.

As illustrated in FIG. 9, a first lower redistribution wiring layer including first lower redistribution wirings 312 may be formed on the first lower insulation layer 310. The first lower redistribution wirings 312 may contact the chip pads 210 and the first metal wirings 122 through the first openings, respectively.

In example embodiments, the first lower redistribution wiring 312 may be formed on portions of the first lower insulation layer 310, the chip pads 210 and the first metal wirings 122. The first redistribution wiring may be formed by forming a seed layer on a portion of the first lower insulation layer 310 and in the first opening, patterning the seed layer and performing an electro plating process. Accordingly, at least portions of the first lower redistribution wirings 312 may contact the chip pads 210 and the first metal wirings 122 through the first openings. The third dummy pattern 314 may be formed by the same process as the first redistribution wirings 312.

For example, the first redistribution wiring may include aluminum (Al), copper (Cu), tin (Sn), nickel (Ni), gold (Au), platinum (Pt) or an alloy thereof. A thickness of the first lower redistribution wiring layer may have a value from 3 μm to 8 μm.

As illustrated in FIG. 10, a second lower insulation layer 320 may be formed on the first lower insulation layer 310, and then, the second lower insulation layer 320 may be patterned to form second openings that expose the first lower redistribution wirings 312, respectively. Then, a second redistribution wiring layer including second lower redistribution wirings 322 may be formed on the second lower insulation layer 320. The second lower redistribution wirings 322 may contact the first lower redistribution wirings 312 through the second openings, respectively.

Similarly, a third lower insulation layer 330 may be formed on the second lower insulation layer 320, and then, the third lower insulation layer 330 may be patterned to form third openings that expose the second lower redistribution wirings 322, respectively. Then, a third lower redistribution wiring layer including third lower redistribution wirings 332 may be formed on the third lower insulation layer 330. Then, a fourth lower insulation layer 340 may be formed on the third lower insulation layer 330 to cover the third lower redistribution wirings 332.

The fourth lower insulation layer 340 may serve as a passivation layer. The fourth lower insulation layer 340 may be partially removed by an opening forming process to expose portions of the third lower redistribution wirings 332. A bump pad such as UBM (Under Bump Metallurgy) may be formed on the portion of the third lower redistribution wiring 332 exposed by the fourth lower insulation layer 340.

Figure 11:
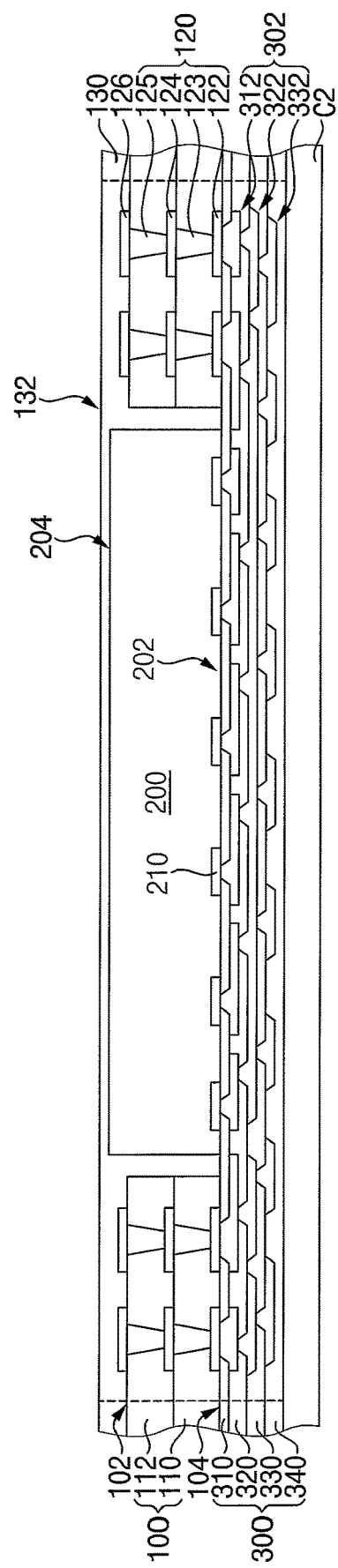

Referring to FIG. 11, the first carrier substrate C1 may be removed, the structure in FIG. 10 may be reversed, and then, the lower redistribution wiring layer 300 may be adhered on a second carrier substrate C2. Accordingly, an upper surface 132 of the sealing layer 130 may be exposed.

Figure 12:
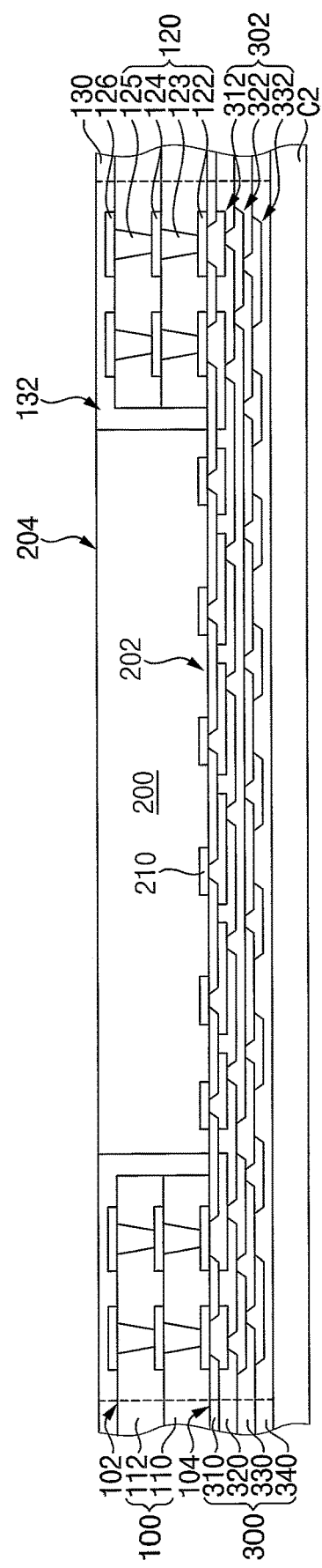

Referring to FIG. 12, the upper surface 132 of the sealing layer 130 may be grinded to expose the backside surface 204 of the semiconductor chip 200. Such grinding may partially remove the backside surface 204 of the semiconductor chip 200.

The upper surface 132 of the sealing layer 130 and the backside surface 204 of the semiconductor chip 200 may be grinded by a grinding process such as a chemical mechanical polishing process. Thus, the backside surface 204 of the semiconductor chip 200 may be coplanar with the upper surface 132 of the sealing layer 130. The sidewall of the semiconductor chip 200, the first surface 102 of the core substrate 100 and the inner wall of the cavity 106 may be covered by the sealing layer 130.

Referring to FIGS. 13 to 21, an upper redistribution wiring layer 350 may be formed on the sealing layer 130 on the first surface 102 of the core substrate 100 and the backside surface 204 of the semiconductor chip 200. The upper redistribution wiring layer 350 including second redistribution wirings electrically connected to the core connection wirings 120 and a thermal pattern 374 may be formed on the sealing layer 130 of the first surface 102 of the core substrate 100 and the backside surface 204 of the semiconductor chip 200. The upper redistribution wiring layer 350 may be a backside redistribution wiring layer.

Figure 13:
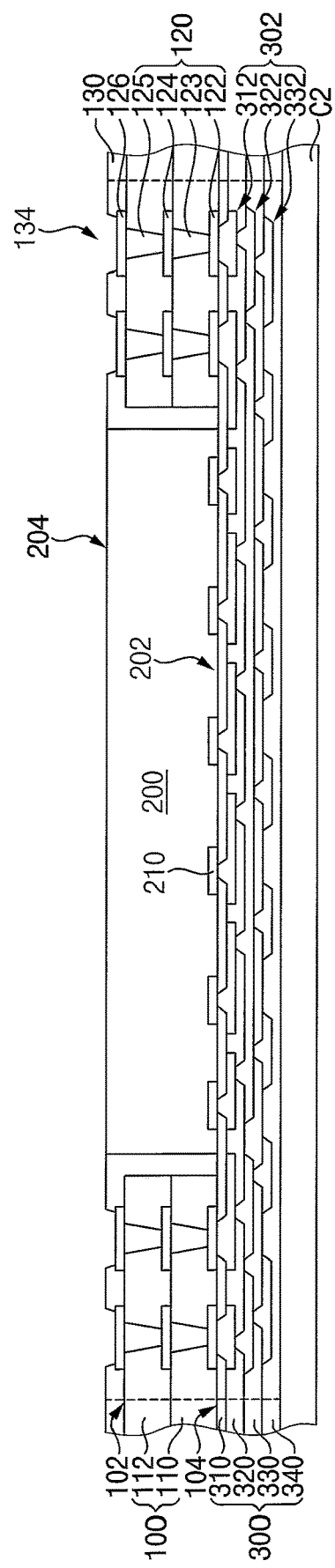

As illustrated in FIG. 13, the sealing layer 130 on the first surface 102 of the core substrate 100 may be partially removed to form fourth openings 134 that expose portions of the third metal wirings 126 of the core connection wirings 120.

For example, the fourth openings 134 may be formed using a laser. Examples of the laser may be $CO_2$ laser, YAG laser, excimer laser, UV laser, etc.

Figure 14:
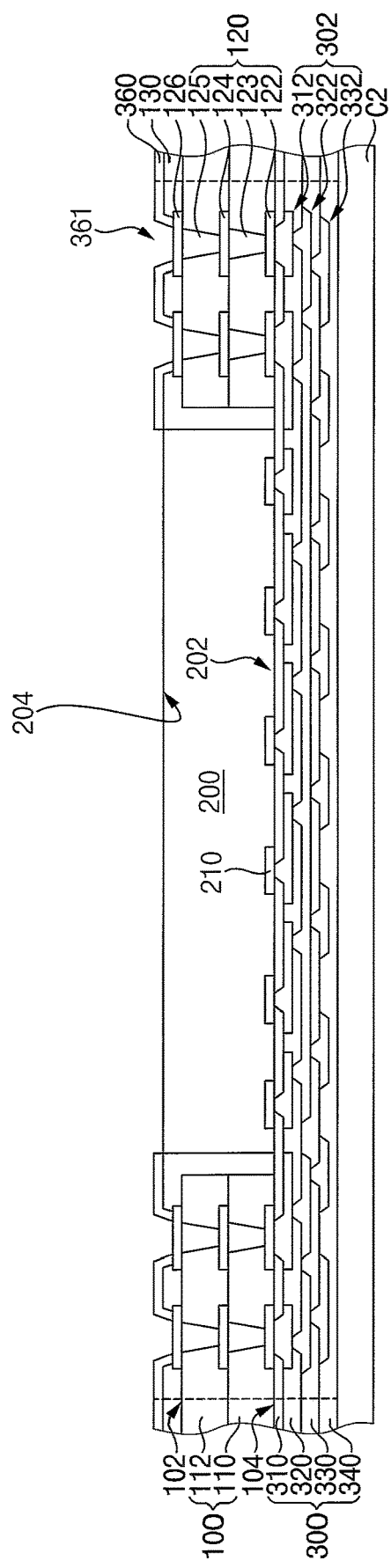

As illustrated in FIG. 14, a protective layer pattern 360 may be formed on the upper surface 132 of the sealing layer 130. The protective layer pattern 360 may expose the backside surface 204 of the semiconductor chip 200. The protective layer pattern 360 may have fourth openings that are connected to the fourth openings, respectively. Accordingly, the protective layer pattern 360 may expose the third metal wirings 126 of the core connection wirings 120.

For example, the protective layer pattern 360 may be formed by forming a protective layer such as PID (Photo Imageable Dielectric) on the upper surface 132 of the sealing layer 130 and the backside surface 204 of the semiconductor chip 200 and patterning the protective layer to form the fifth openings that expose the backside surface 204 of the semiconductor chip 200 and the third metal wirings 126 of the core connection wirings 120.

Figure 15:
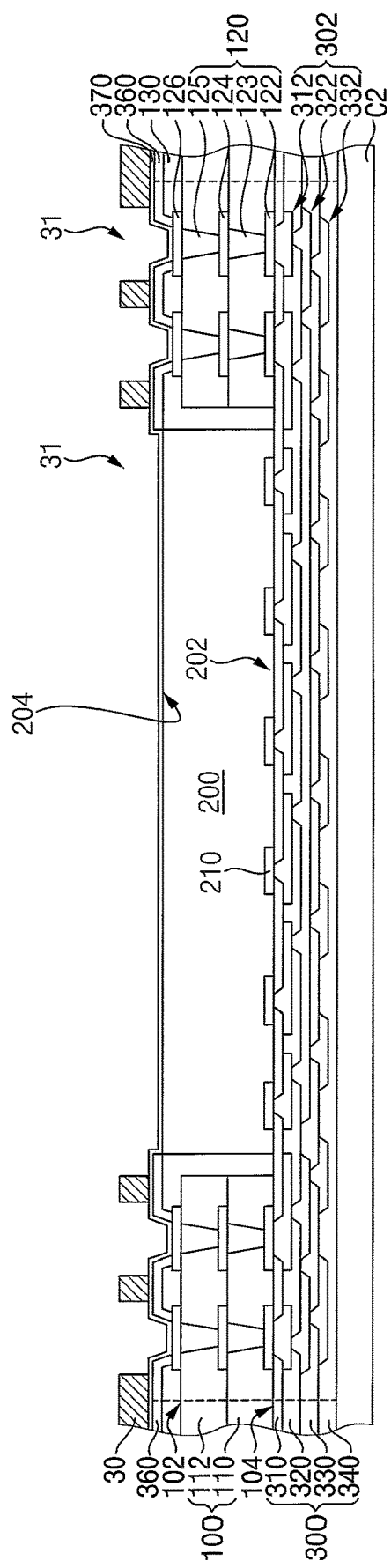

As illustrated in FIG. 15, a seed layer 370 may be formed on the backside surface 204 of the semiconductor chip 200 and the third metal wirings 126 of the core connection wiring 120 exposed by the protective layer pattern 360, and a photoresist pattern 30 having openings 31 that expose the semiconductor chip 200 and portions of the seed layer may be formed on the seed layer 370.

For example, the seed layer 370 may be formed by a sputtering process. The seed layer 370 may include an alloy layer including titanium/copper (Ti/Cu), titanium/palladium (Ti/Pd), titanium/nickel (Ti/Ni), chrome/copper (Cr/Cu) or a combination thereof. A thickness of the seed layer 370 may have a value from 0.1 μm to 0.5 μm.

Because the protective layer pattern 360 covers the upper surface 132 of the sealing layer 130, the fillers within the sealing layer 130 may be prevented from escaping from the sealing layer 130 including an insulation film such as ABF (Ajinomoto Build-up Film) during the sputtering process.

The photoresist layer may be formed on the upper surface 132 of the sealing layer 130 and the backside surface 204 of the semiconductor chip 200, and an exposure process may be performed on the photoresist pattern to form the photoresist pattern 30 having the openings 31 that expose the semiconductor chip 200 and the portions of the seed layer 370.

Figure 16:
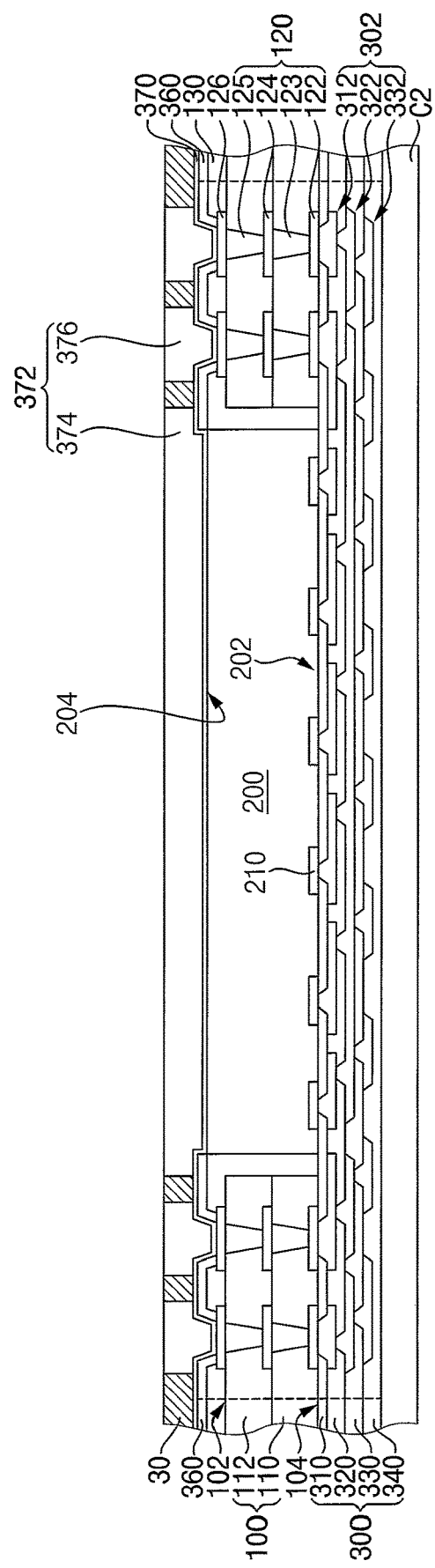
Figure 17:
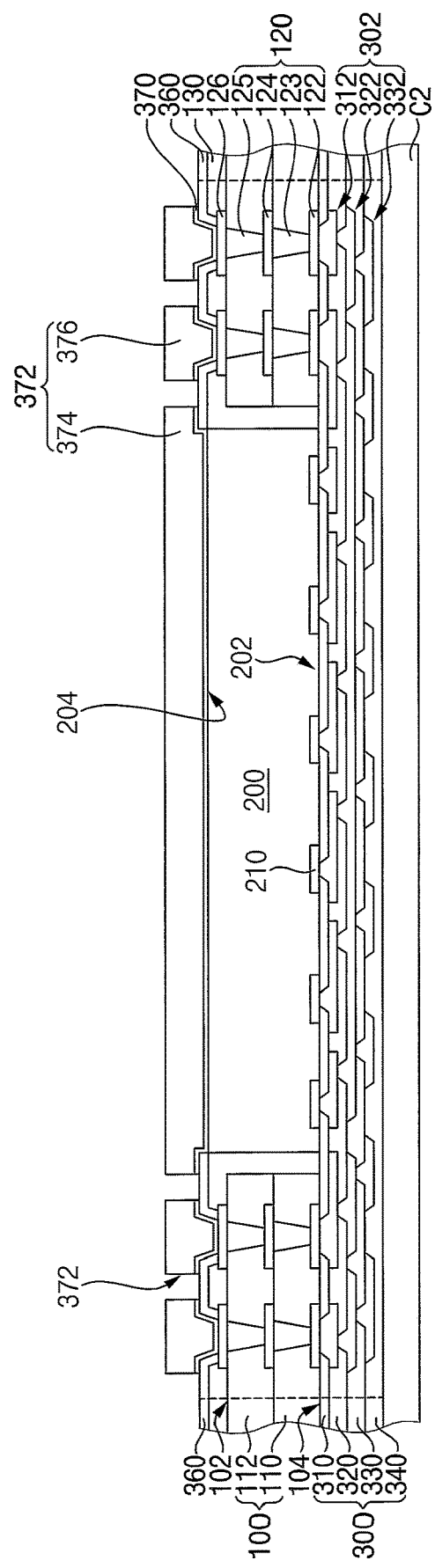

As illustrated in FIGS. 16 and 17, an electroplating process may be formed on the seed layer 370 to form a first upper redistribution wiring layer including first upper metal patterns 372 having a metal material, and the photoresist pattern 30 may be removed to form the thermal pattern 374 arranged on the backside surface 204 of the semiconductor chip 200 and first upper redistribution wirings 376 electrically connected to the core connection wirings 120. With the removal of the photoresist pattern 30, the seed layer 370 under the photoresist pattern 30 may be partially etched.

The thermal pattern 374 may be formed to cover the entire backside surface 204 of the semiconductor chip 200. Because the thermal pattern 374 and the first upper redistribution wirings 376 are formed together, the thermal pattern 374 may be coplanar with the first upper redistribution wiring 376.

The thermal pattern 374 may include a ground pattern. The first upper redistribution wiring 376 may include a signal pattern. The first upper metal pattern 372 may include a ground pattern (not illustrated) arranged around the signal pattern in the fan out region. The ground pattern may include a metal pattern having a plurality of through holes. The through hole may have a cylindrical or polygonal column shape. The through hole may serve to discharge a gas in the insulation film in a package process such as a curing process.

For example, the metal material may include a metal such as copper (Cu), silver (Ag), gold (Au), nickel (Ni), platinum (Pt), aluminum (Al), etc. A thickness of the thermal pattern 374 may have a value from 3 μm to 50 μm. The thickness of the thermal pattern 374 may be the same as a thickness of the first upper redistribution wiring 376. The present inventive concept is not limited thereto. For example, the thickness of the thermal pattern 374 may be the different from a thickness of the first upper redistribution wiring 376.

When the thermal pattern 374 includes copper (Cu), since a thermal conductivity of copper (Cu) is 401 W/(m·K), the thermal pattern 374 may be in direct thermal contact with the backside surface 204 of the semiconductor chip 200 to effectively dissipate heat from the semiconductor chip 200.

Figure 18:
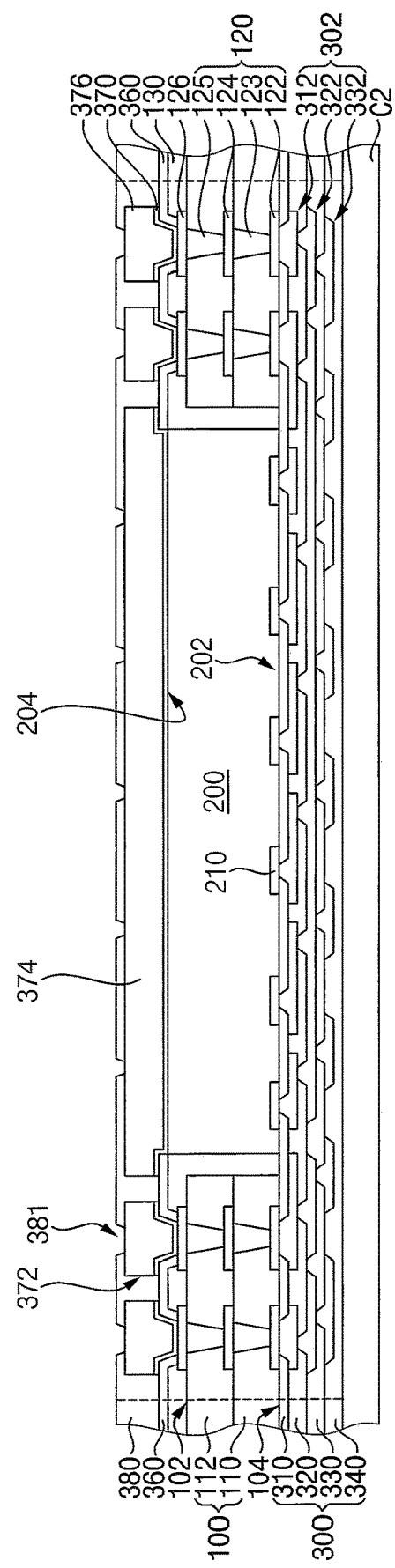

As illustrated in FIG. 18, a first upper insulation layer 380 may be formed on the first surface 102 of the core substrate 100 and the backside surface 204 of the semiconductor chip 200, and then, the first upper insulation layer 380 may be patterned to form sixth openings 381 that expose the first upper metal patterns 372, respectively. The sixth openings 381 may expose portions of the thermal pattern 374 and the first upper redistribution wirings 376.

For example, the first upper insulation layer may include an insulation material such as epoxy resin (thermoset dielectric material), a photo imageable dielectric (PID) material, an insulation film such as ABF (Ajinomoto Build-up Film), etc.

Figure 19:
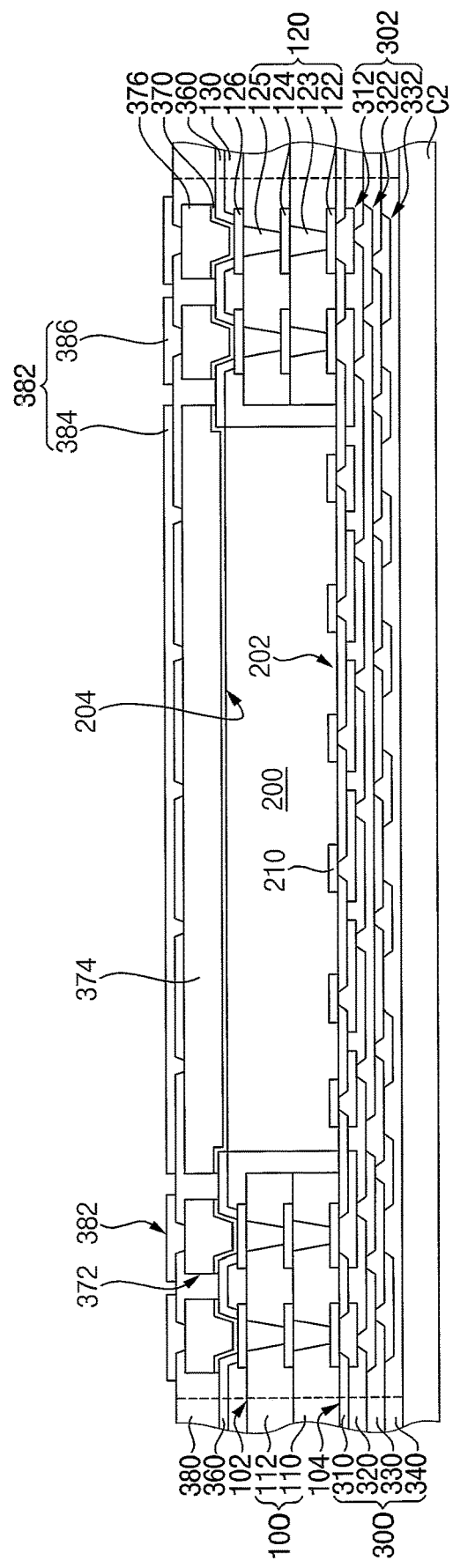

As illustrated in FIG. 19, a second upper redistribution wiring layer including second upper metal patterns 382 may be formed on the first upper insulation layer 380. The second upper metal patterns 382 may include second upper redistribution wirings 386 electrically connected to the first upper redistribution wirings 376. The second upper metal patterns 382 may further include a metal pattern 384 electrically connected to the thermal pattern 374. The metal pattern 384 may include a ground pattern. As shown in FIG. 2, the metal pattern 384 may include a ground pattern GP electrically connected to the thermal pattern 374. The ground pattern GP of the metal pattern 384 may contact portions of the thermal pattern 374 through a plurality of openings OP formed in the first upper insulation layer 380. The openings OP may penetrate the first upper insulation layer 380 to expose the thermal pattern 374. The thermal pattern 374 may be disposed between the metal pattern 384 and the backside surface 204 of the semiconductor chip 200 or between the ground pattern 384 and the backside surface 204 of the semiconductor chip 200.

For example, the second upper redistribution wirings may include copper (Cu), silver (Ag), gold (Au), nickel (Ni), platinum (Pt), aluminum (Al), etc. A thickness of the second upper redistribution wiring may have a value from 3 μm to 8 μm. The thickness of the second upper redistribution wirings may be the same as the thickness of each of the lower redistribution wirings 312, 322, 332. The present inventive concept is not limited thereto. For example, the thickness of the second upper redistribution wirings may be different from the thickness of each of the lower redistribution wirings 312, 322, 332.

Figure 20:
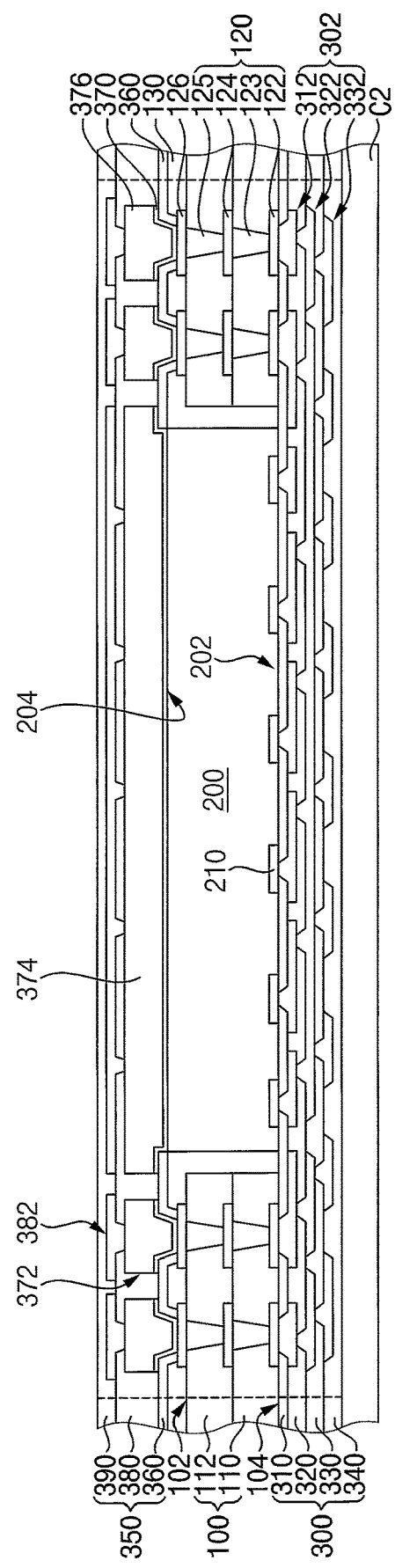
Figure 21:
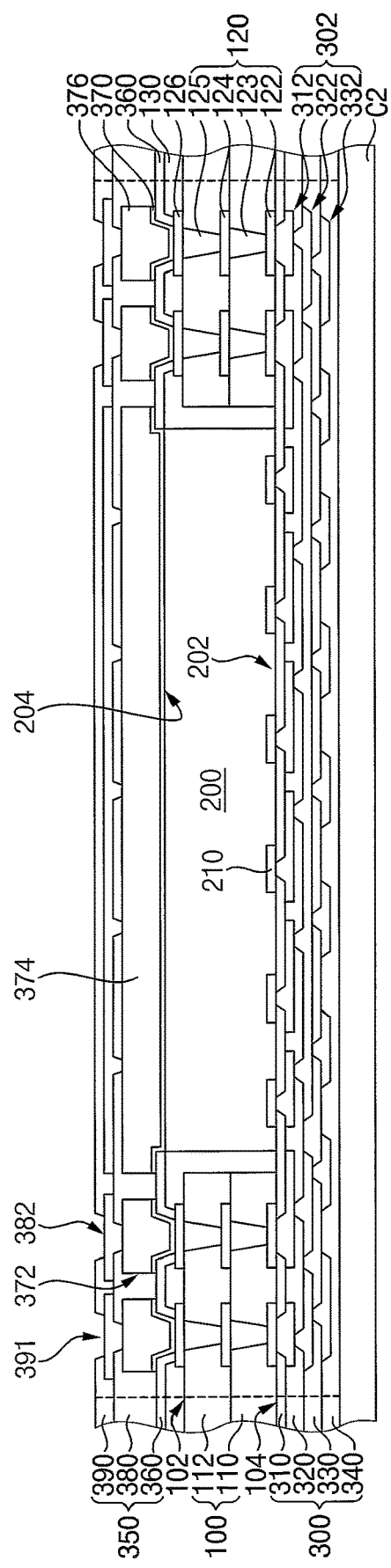

As illustrated in FIGS. 20 and 21, a second upper insulation layer 390 may be formed on the first upper insulation layer 380, and then, the second upper insulation layer 390 may be patterned to form seven openings 391 that expose the second upper redistribution wirings, respectively.

The second upper insulation layer 390 may serve as a passivation layer. A bump pad such as UBM (Under Bump Metallurgy) may be formed on a portion of the second upper redistribution wiring exposed by the second upper insulation layer 390 by a following pad forming process.

Figure 22:
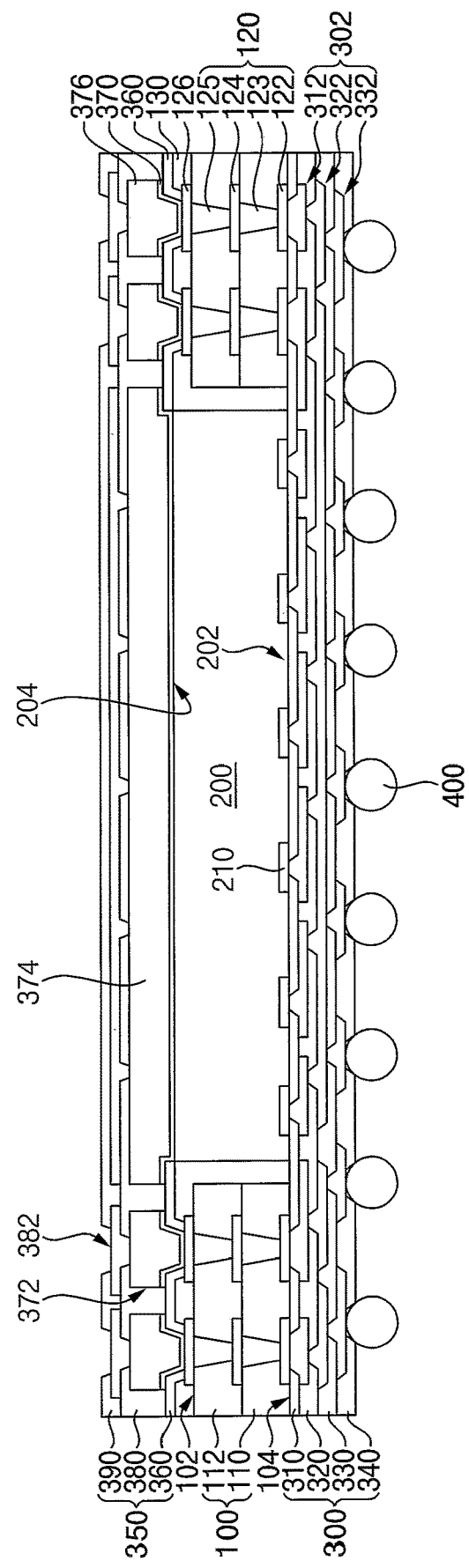

Referring to FIG. 22, outer connection members 400 may be formed on an outer surface of the lower redistribution wiring layer 300 to be electrically connected to the first redistribution wirings 302, respectively.

For example, a solder ball as the outer connection member may be disposed on the portion of the third lower redistribution wiring 332. The portion of the third lower redistribution wiring 332 may serve as a landing pad, that is, a package pad. Thus, semiconductor manufacturing processes may be performed to form the lower redistribution wiring layer 300 having fan-out type solder ball landing pads.

Then, a sawing process may be performed on the core substrate 100 to form an individual fan-out panel level package including the core substrate 100, the lower redistribution wiring layer 300 formed on the lower surface of the core substrate 100 and the upper redistribution wiring layer 350 formed on the upper surface of the core substrate 100.

Figure 23:
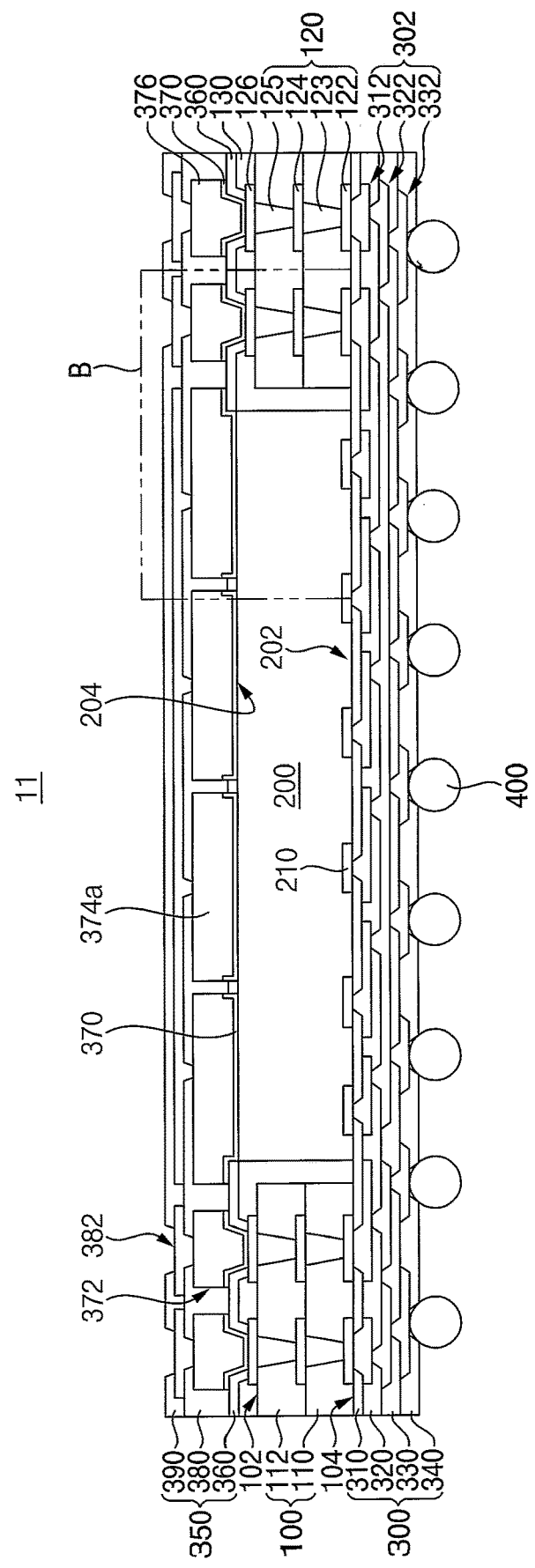
Figure 24:
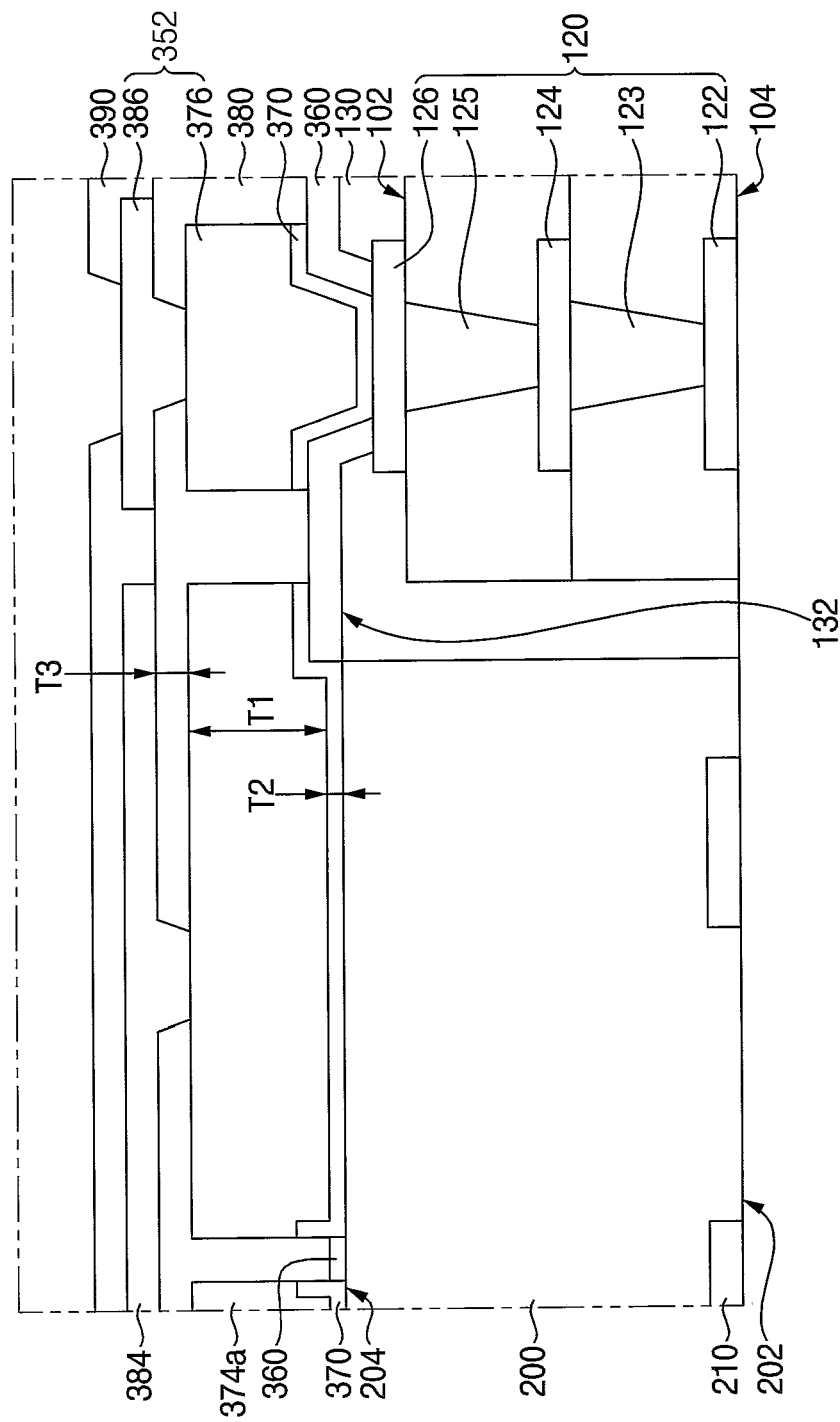

FIG. 23 is a cross-sectional view illustrating a semiconductor package in accordance with example embodiments. FIG. 24 is an enlarged cross-sectional view illustrating portion 'B' in FIG. 23. FIG. 25 is a plan view illustrating first upper redistribution wirings and a thermal pattern of an upper redistribution wiring layer in FIG. 23. The semiconductor package may be substantially the same as or similar to the semiconductor package described with reference to FIG. 1 except for a configuration of a thermal pattern and a protective layer pattern. Thus, same reference numerals will be used to refer to the same or like elements and any further repetitive explanation concerning the above elements will be omitted. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Referring to FIGS. 23 to 25, an upper redistribution wiring layer 350 of a semiconductor package 11 may include first and second upper metal patterns 372, 382 stacked in two levels. The first upper metal pattern 372 may include a thermal pattern 374a and a first upper redistribution wiring 376. The second upper metal pattern 382 may include a metal pattern 384 and a second upper redistribution wiring 386. Second redistribution wirings 352 may include the first and second upper redistribution wirings 376, 386 stacked in two levels.

In example embodiments, a protective layer pattern 360 arranged on a backside surface 204 of the semiconductor chip 200 may have a grid pattern. The grid pattern of the protective layer pattern 360 may include a plurality of crossing lines extending respectively in X direction and Y direction on the backside surface 204 of the semiconductor chip 200.

A seed layer 370 may be provided on the backside surface 204 of the semiconductor chip 200 exposed by the grid pattern of the protective layer pattern 360.

As illustrated in FIG. 25, because the thermal pattern 374a is formed on the seed layer 370 on the backside surface 204 of the semiconductor chip 200, the thermal pattern 374a may include a metal pattern of a grid shape covering the backside surface 204 of the semiconductor chip 200.

Alternatively, when the protective layer pattern 360 on the backside surface 204 of the semiconductor chip 200 has an array shape of a plurality of holes, the thermal pattern 374a may also have an array shape corresponding thereto.

Hereinafter, a method of manufacturing the semiconductor package in FIG. 23 will be explained.

FIGS. 26 to 31 are cross-sectional views illustrating a method of manufacturing a semiconductor package in accordance with example embodiments.

Figure 26:
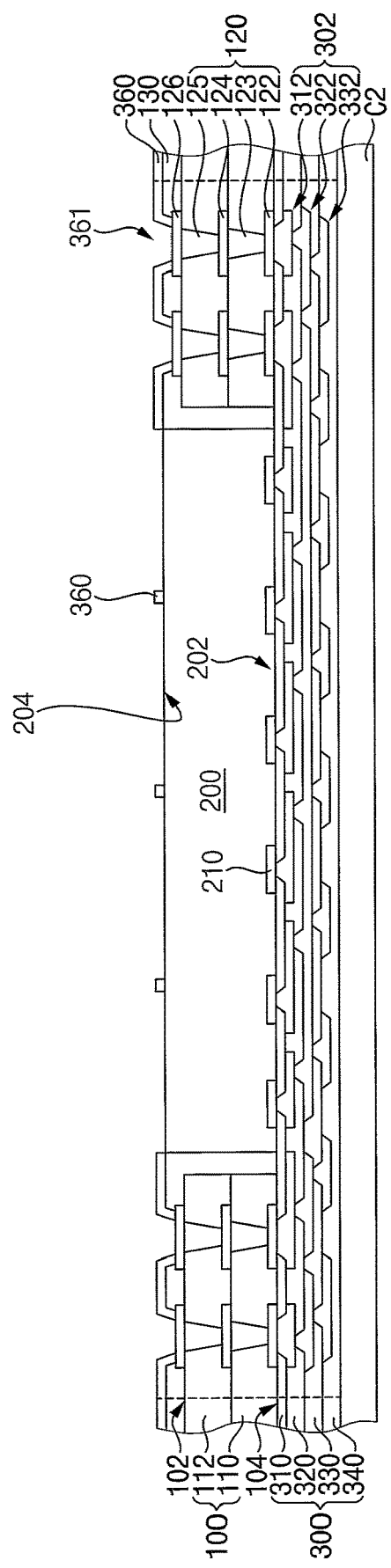

Referring to FIG. 26, processes which are the same as or similar to the processes described with reference to FIGS. 4 to 13 may be performed to form a sealing layer 130 covering a first surface 102 of a core substrate 100 and exposing a backside surface 204 of the semiconductor chip 200, and then, a protective layer pattern 360 may be formed on an upper surface 132 of the sealing layer 130 and the backside surface 204 of the semiconductor chip 200.

For example, a protective layer such as PID (Photo Imageable Dielectric) may be formed on the upper surface 132 of the sealing layer 130 and the backside surface 204 of the semiconductor chip 200, and then, the protective layer may be patterned to form openings that expose the backside surface 204 of the semiconductor chip 200 and third metal wirings 126 of core connection wirings 120, to form the protective layer pattern 360.

The protective layer pattern 360 formed on the backside surface 204 of the semiconductor chip 200 may have a grid pattern. The grid pattern of the protective layer pattern 360 may include a plurality of crossing lines extending respectively in X direction and Y direction on the backside surface 204 of the semiconductor chip 200.

Figure 27:
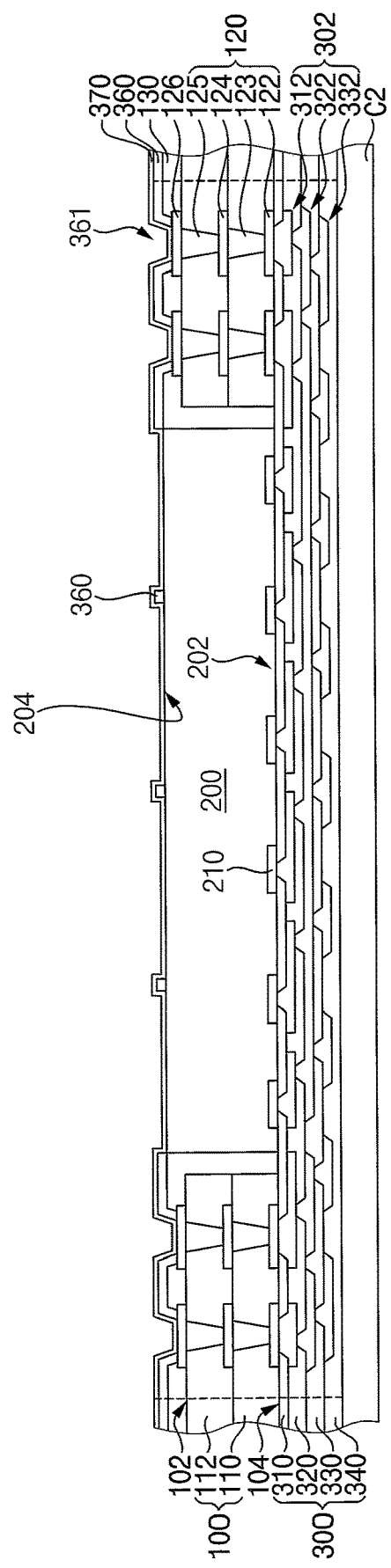

Referring to FIG. 27, a seed layer 370 may be formed on the backside surface 204 of the semiconductor chip 200 and the third metal wirings 126 of the core connection wirings 120. For example, the seed layer 370 may be formed by a sputtering process.

Figure 28:
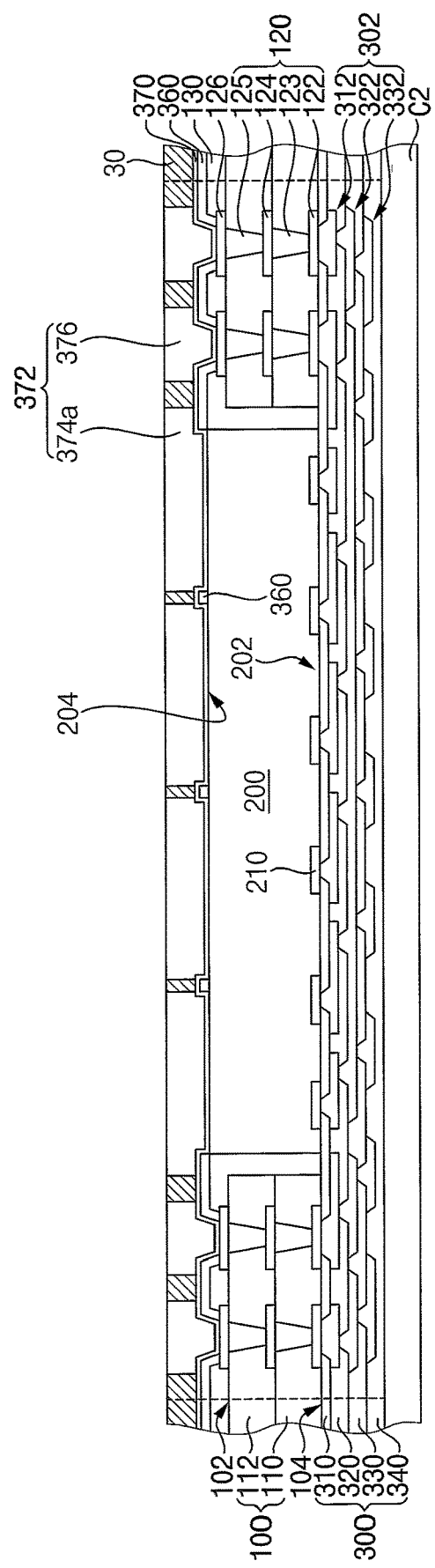
Figure 29:
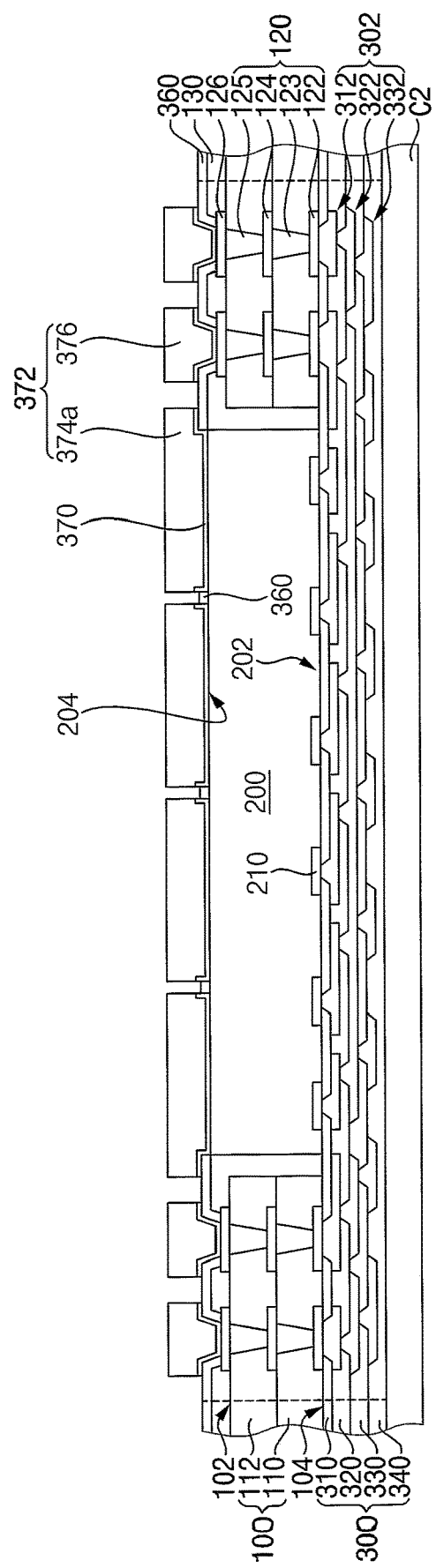

Referring to FIGS. 28 and 29, a photoresist pattern 30 having openings that expose the semiconductor chip 200 and portions of the seed layer on the third metal wirings 126 may be formed on the seed layer 370, and then, a plating process may be performed on the seed layer 370 to form a first upper redistribution wiring layer including first upper metal patterns 372 including a metal material. Then, the photoresist pattern 30 may be removed and the seed layer 370 under the photoresist pattern 30 may be etched.

For example, a photoresist layer may be formed on the upper surface 132 of the sealing layer 130 and the backside surface 204 of the semiconductor chip 200, and then, ex exposure process may be performed on the photoresist layer to form the photoresist pattern 30 having the openings that expose the semiconductor chip 200 and the portions of the seed layer on the third metal wirings 126.

The photoresist pattern 30 formed on the backside surface 204 of the semiconductor chip 200 may be formed to have a grid shape corresponding to the shape of the protective layer pattern 306. For example, when the protective layer pattern 360 on the backside surface 204 of the semiconductor chip 200 has an array shape of a plurality of holes, the photoresist pattern 30 may also have an array shape corresponding thereto.

The first upper metal patterns 372 formed on the seed layer 370 by the plating process may include a thermal pattern 374a arranged on the backside surface 204 of the semiconductor chip 200 and first upper redistribution wirings 376 electrically connected to the core connection wirings 120. The thermal pattern 374a may include a metal pattern of a grid shape covering the backside surface 204 of the semiconductor chip 200.

Figure 30:
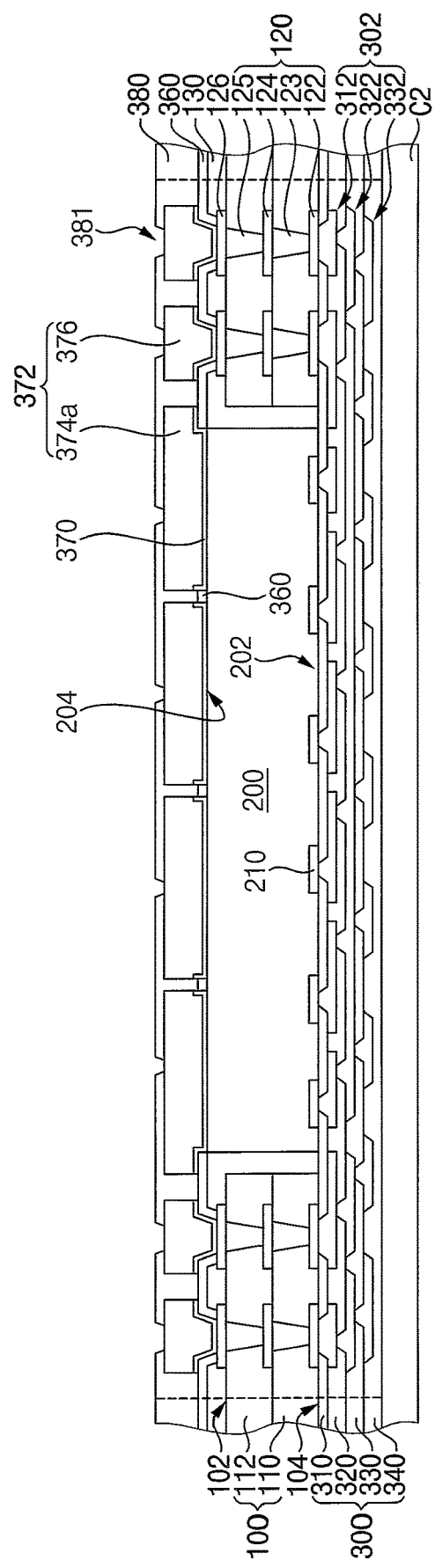

Referring to FIG. 30, a first upper insulation layer 380 may be formed to cover the first surface 102 of the core substrate 100 and the backside surface 204 of the semiconductor chip 200, and then, the first upper insulation layer 380 may be patterned to form sixth openings 381 that expose the first upper metal patterns 372, respectively. The sixth openings 381 may expose portions of the thermal pattern 374a and the first upper redistribution wirings 376.

Figure 31:
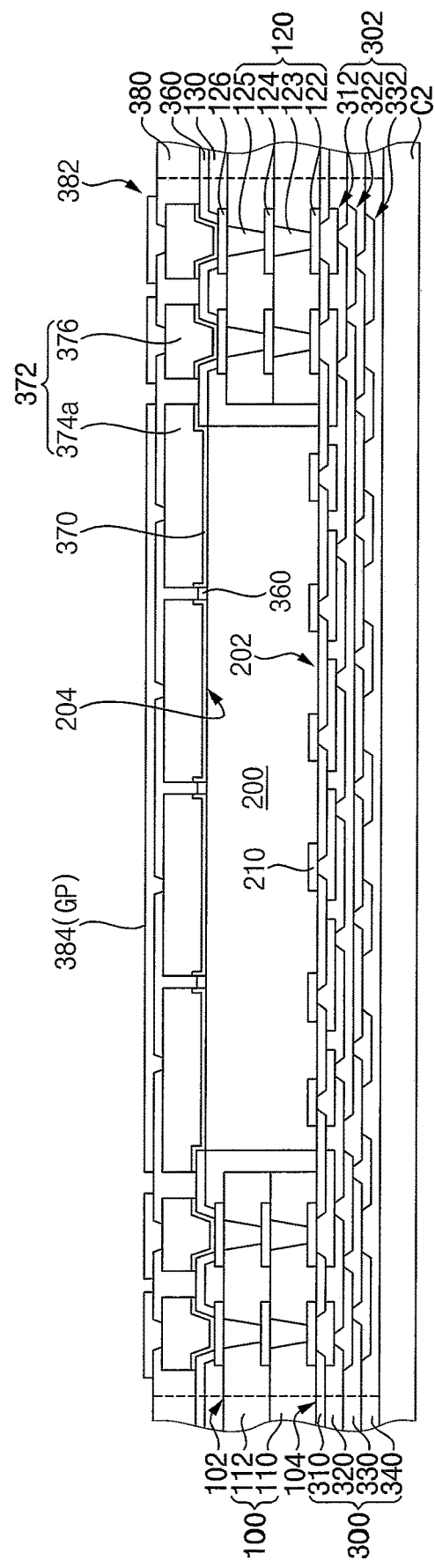

Referring to FIG. 31, a second upper redistribution wiring layer including second upper metal patterns 382 may be formed on the first upper insulation layer 380. The second upper metal patterns 382 may include second upper redistribution wirings electrically connected to the first upper redistribution wirings 376 and a metal pattern electrically connected to the thermal pattern 374a. The metal pattern may include a ground pattern GP.

Then, processes which are the same as or similar to the processes described with reference to FIGS. 20 to 22 may be performed to form an upper redistribution wiring layer including first and second upper insulation layers 380, 390 and outer connection members 400 on an outer surface of a lower redistribution wiring layer 300.

Then, a sawing process may be performed on the core substrate 100 to form an individual fan-out panel level package including the core substrate 100, the lower redistribution wiring layer 300 formed on a lower surface of the core substrate 100 and the upper redistribution wiring layer formed on an upper surface of the core substrate 100.

Figure 32:
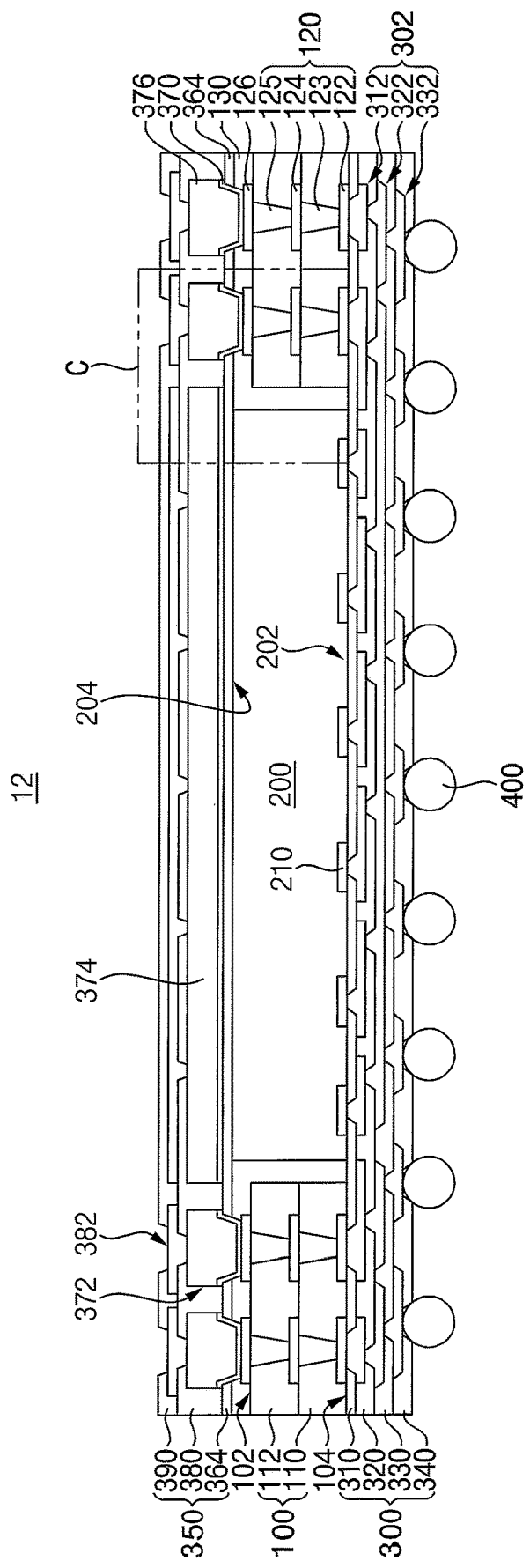
Figure 33:
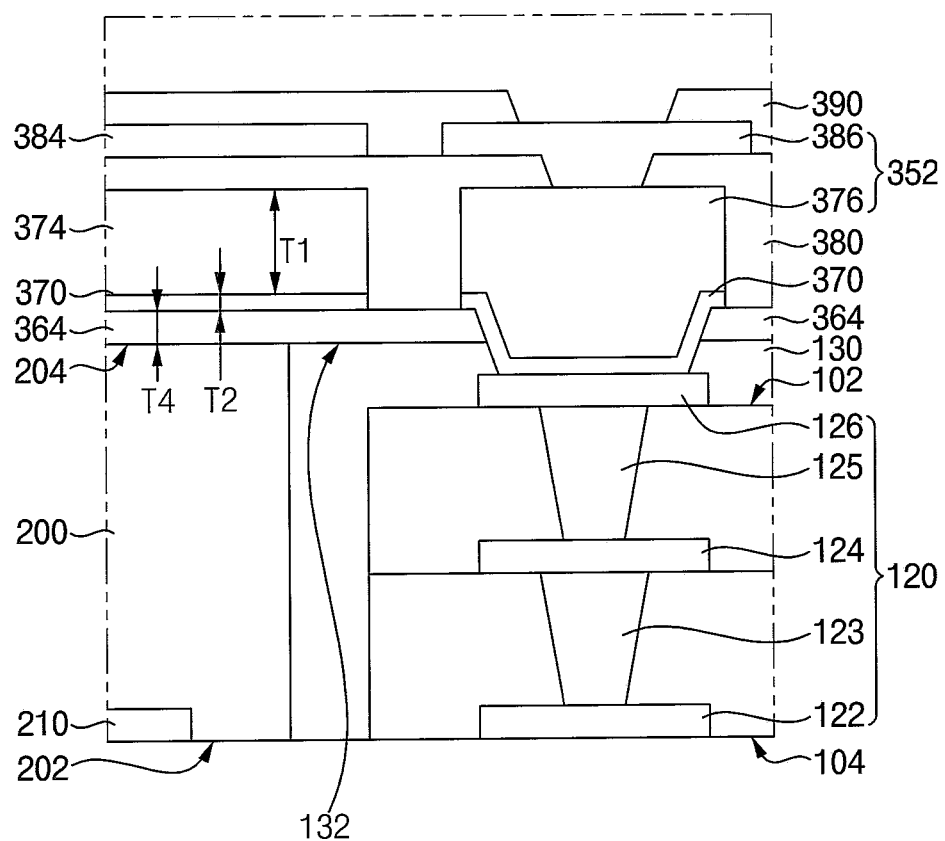

FIG. 32 is a cross-sectional view illustrating a semiconductor package in accordance with example embodiments. FIG. 33 is an enlarged cross-sectional view illustrating portion 'C' in FIG. 32. The semiconductor package may be substantially the same as or similar to the semiconductor package described with reference to FIG. 1 except for a configuration of a barrier layer. Thus, same reference numerals will be used to refer to the same or like elements and any further repetitive explanation concerning the above elements will be omitted.

Referring to FIGS. 32 and 33, an upper redistribution wiring layer 350 of a semiconductor package 12 may include an oxide layer 364 provided on a backside surface 204 of a semiconductor chip 200 and an upper surface 132 of a sealing layer 130.

In example embodiments, the oxide layer 364 may be provided to cover the entire backside surface 204 of the semiconductor chip 200. The oxide layer 364 may have openings that expose third metal wirings 126 of core connection wirings 120. A seed layer 370 may be provided on the oxide layer 364 on the backside surface 204 of the semiconductor chip 200. The oxide layer 364 and the seed layer 370 may serve as a barrier layer provided between a thermal pattern 374 and the backside surface 204 of the semiconductor chip 200.

As illustrated in FIG. 33, a thickness T1 of the thermal pattern 374 may have a value from 3 μm to 50 μm. A thickness T2 of the seed layer 370 may have a value from 0.1 μm to 0.5 μm. A thickness T3 of the oxide layer 364 may have a value from 0.1 μm to 0.5 μm.

Alternatively, the upper redistribution wiring layer 350 of a semiconductor package 12 may include an adhesive layer instead of the oxide layer. The adhesive layer may include an adhesive film such as a die attach film (DAF). The adhesive layer may further include metal fillers therein capable of improving heat dissipation performance. A copper foil may be attached on the adhesive layer.

Hereinafter, a method of manufacturing the semiconductor package in FIG. 32 will be explained.

FIGS. 34 to 39 are cross-sectional views illustrating a method of manufacturing a semiconductor package in accordance with example embodiments.

Figure 34:
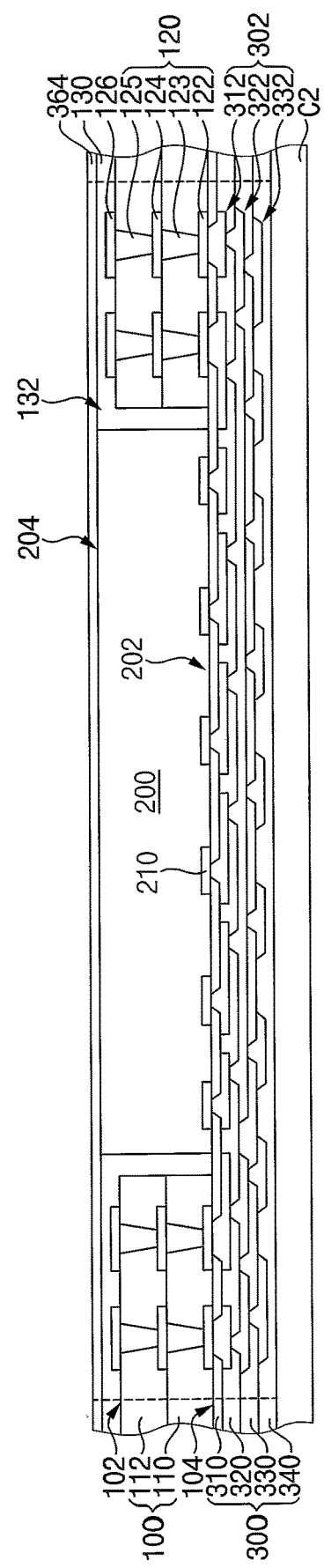

Referring to FIG. 34, processes which are the same as or similar to the processes described with reference to FIGS. 4 to 12 may be performed form a sealing layer 130 covering a first surface 102 of a core substrate 100 and exposing a backside surface 204 of the semiconductor chip 200, and then, an oxide layer 364 as a barrier layer may be formed on an upper surface 132 of the sealing layer 130 and the backside surface 204 of the semiconductor chip 200.

For example, the oxide layer 364 may be formed on the upper surface 132 of the sealing layer 130 and the backside surface 204 of the semiconductor chip 200. The oxide layer 364 may be formed by a chemical vapor deposition process. For example, the oxide layer 364 may include silicon oxide. A thickness of the oxide layer may have a value from 0.1 μm to 0.5 μm.

Alternatively, instead of the oxide layer, an adhesive layer may be formed on the upper surface 132 of the sealing layer 130 and the backside surface 204 of the semiconductor chip 200. The adhesive layer may include an adhesive film such as die attach film (DAF). A copper foil may be attached on the adhesive layer.

Figure 35:
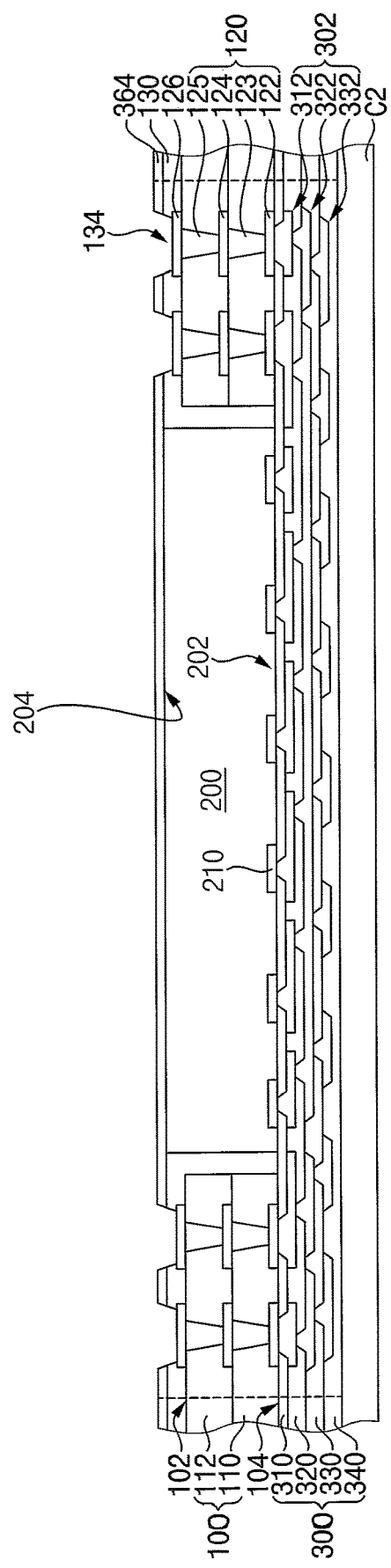

Referring to FIG. 35, the sealing layer 130 and the oxide layer 364 on the first surface 102 of the core substrate 100 may be partially removed to form fourth openings 134 that expose third metal wirings 126 of core connection wirings 120.

For example, the fourth openings 134 may be formed using a laser. Examples of the laser may be $CO_2$ laser, YAG laser, excimer laser, UV laser, etc.

Figure 36:
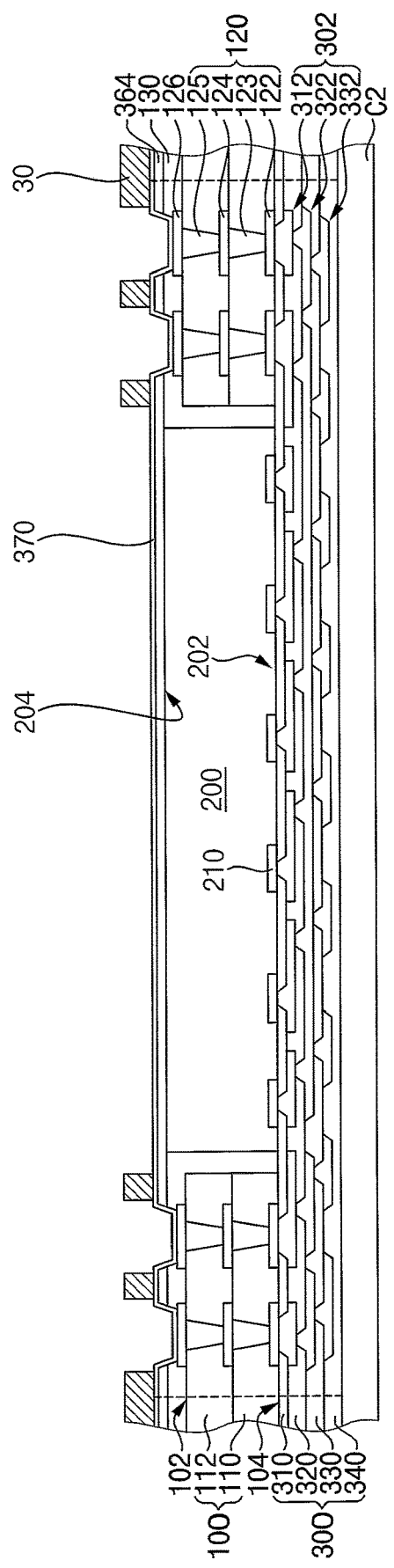

Referring to FIG. 36, a seed layer 370 may be formed on the third metal wirings 126 of the core connection wirings 120 exposed by the oxide layer 364 and the fourth openings 134, and then, a photoresist pattern 30 having openings that expose the semiconductor chip 200 and portions of the seed layer on the third metal wirings 126 may be formed on the seed layer 370.

For example, the seed layer 370 may be formed by a sputtering process. The seed layer 370 may include an alloy layer including titanium/copper (Ti/Cu), titanium/palladium (Ti/Pd), titanium/nickel (Ti/Ni), chrome/copper (Cr/Cu) or a combination thereof. A thickness of the seed layer 370 may have a value from 0.1 μm to 0.5 μm.

A photoresist layer may be formed on to cover the seed layer 370, and then, an exposure process may be performed on the photoresist layer to form the photoresist pattern 30 having the openings that expose the semiconductor chip 200 and the portions of the seed layer 370 on the third metal wirings 126.

Figure 37:
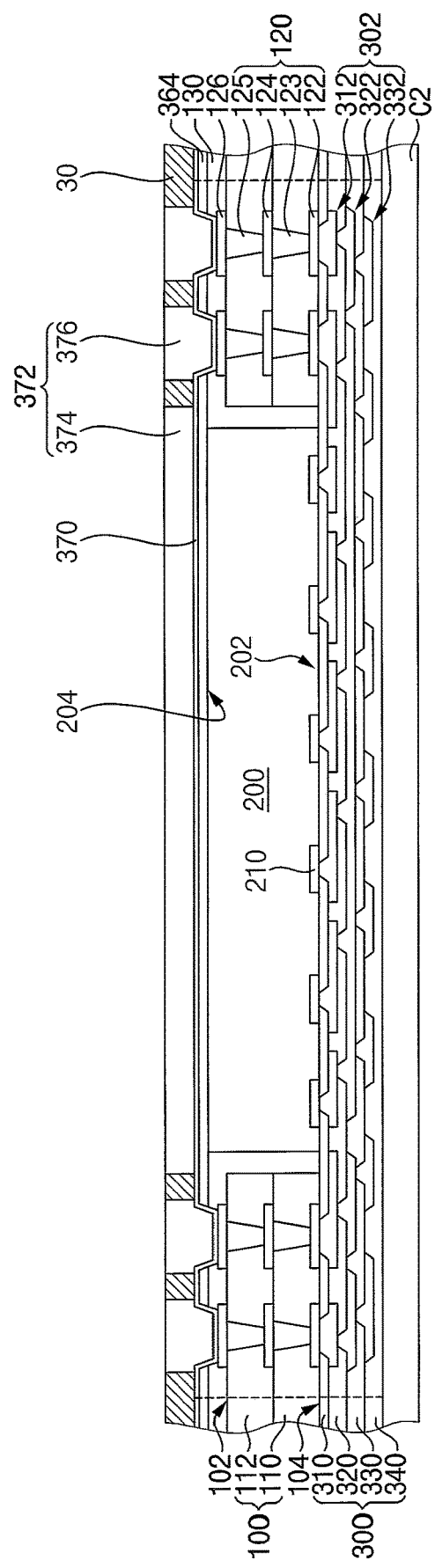
Figure 38:
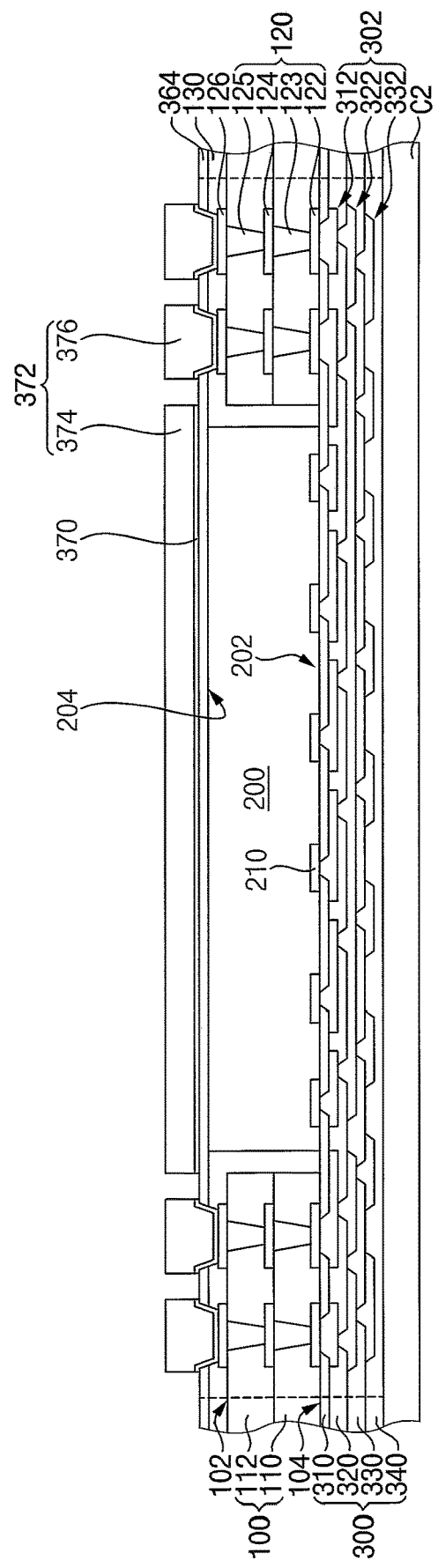

Referring to FIGS. 37 and 38, a plating process may be performed on the seed layer 370 to form a first upper redistribution wiring layer including first upper metal patterns 372 including a metal material, the photoresist pattern may be removed, and then, the seed layer under the photoresist pattern 30 may be partially etched.

The first upper metal pattern 372 on the seed layer 370 by the plating process may include a thermal pattern 374 arranged on the backside surface 204 of the semiconductor chip 200 and first upper redistribution wirings 376 electrically connected to the core connection wirings 120. The thermal pattern 374 may include a metal pattern covering the backside surface 204 of the semiconductor chip 200.

Figure 39:
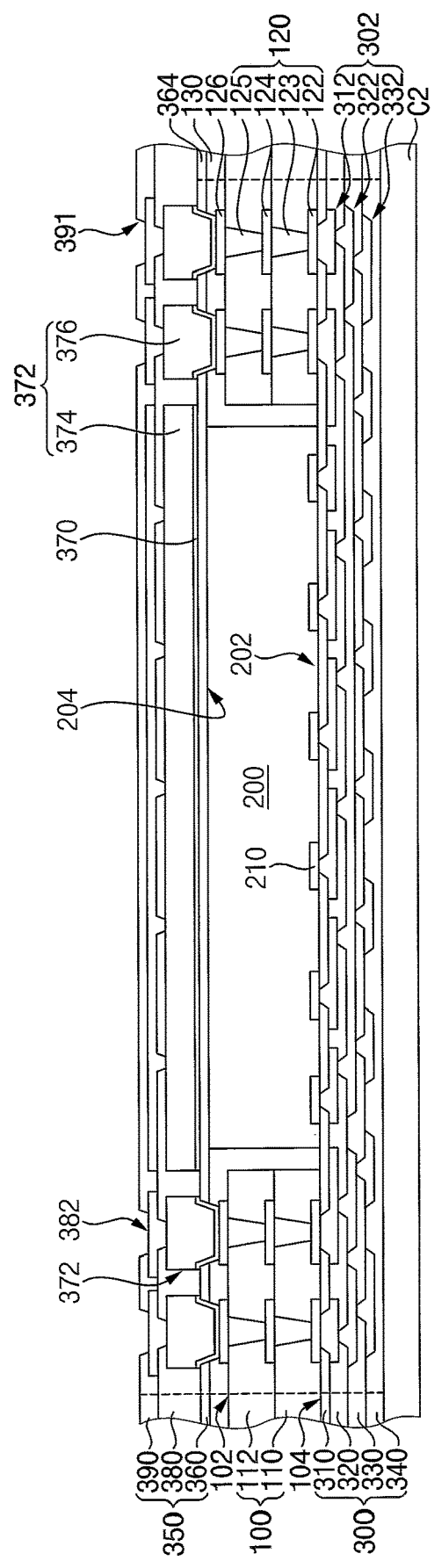

Referring to FIG. 39, a first upper insulation layer 380 may be formed to cover the first surface 102 of the core substrate 100 and the backside surface 204 of the semiconductor chip 200, and then, the first upper insulation layer 380 may be patterned to form sixth openings 381 that expose the first upper metal patterns 372, respectively. The sixth openings 381 may expose portions of the thermal pattern 374 and the first upper redistribution wirings 376.

Then, processes which are the same as or similar to the processes described with reference to FIGS. 19 to 22 may be performed to form an upper redistribution wiring layer including first and second upper insulation layers and outer connection members 400 on an outer surface of a lower redistribution wiring layer 300.

Then, a sawing process may be performed on the core substrate 100 to form an individual fan-out panel level package including the core substrate 100, the lower redistribution wiring layer 300 formed on a lower surface of the core substrate 100 and the upper redistribution wiring layer formed on an upper surface of the core substrate 100.

Figure 40:
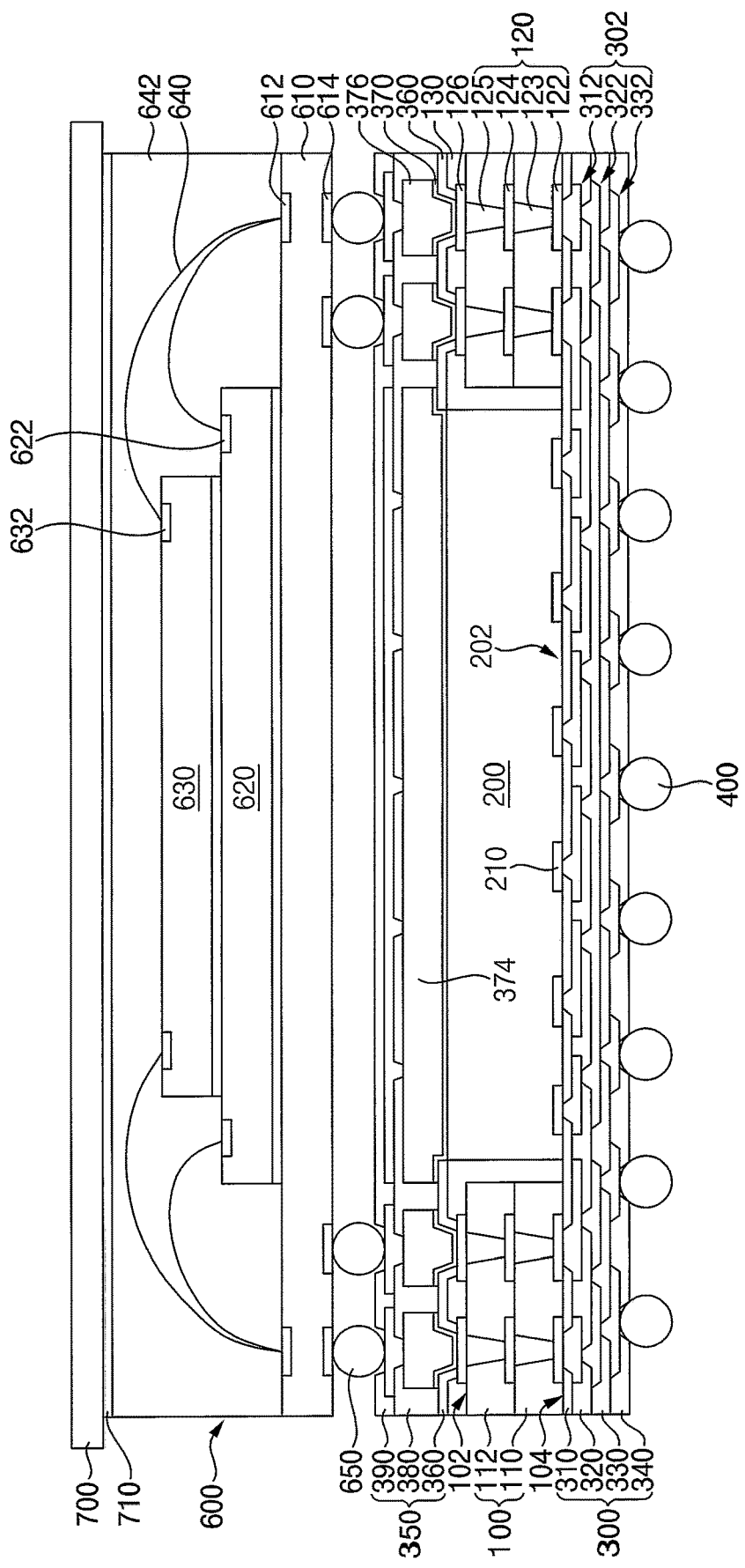

FIG. 40 is a cross-sectional view illustrating a semiconductor package in accordance with example embodiments. The semiconductor package may be substantially the same as or similar to the semiconductor package described with reference to FIG. 1 except for an additional second package. Thus, same reference numerals will be used to refer to the same or like elements and any further repetitive explanation concerning the above elements will be omitted.

Referring to FIG. 40, a semiconductor package 13 may include a first package and a second package 600 stacked on the first package. The semiconductor package 13 may further include a heat sink 700 stacked on the second package 600. The first package may include a core substrate 100, a semiconductor chip 200, a lower redistribution wiring layer 300 and an upper redistribution wiring layer 350. The first package may be substantially the same as or similar to the unit package described with reference to FIG. 1.

In example embodiments, the second package 600 may include a second package substrate 610, second and third semiconductor chips 620, 630 mounted on the second package substrate 610, and a molding member 642 on the second package substrate 610 to cover the second and third semiconductor chips 620, 630.

The second package 600 may be stacked on the first package via conductive connection members 650. For example, the conductive connection members 650 may include solder balls, conductive bumps, etc. The conductive connection member 650 may be arranged between a second upper redistribution wiring 386 and a second bonding pad 614 of the second package substrate 610. Accordingly, the first package and the second package 6800 may be electrically connected to each other by the conductive connection members 650.

The second and third semiconductor chips 620, 630 may be stacked on the second package substrate 610 by adhesive members. Bonding wires 640 may electrically connect chip pads 622, 632 of the second and third semiconductor chips 620, 630 to first bonding pads 612 of the second package substrate 610. The second and third semiconductor chips 620, 630 may be electrically connected to the second package substrate 610 by the bonding wires 640.

Although the second package 600 including two semiconductor chips mounted in a wire bonding manner are illustrated in the figure, it may be understood that the number, the mounting manner, etc. of the semiconductor chips of the second package may not be limited thereto.

In example embodiments, the heat sink 700 may be provided on the second package 600 to dissipate heat from the first and second packages to the outside. The heat sink 700 may be adhered on the second package 600 by a thermal interface material (TIM) 710.

Figure 41:
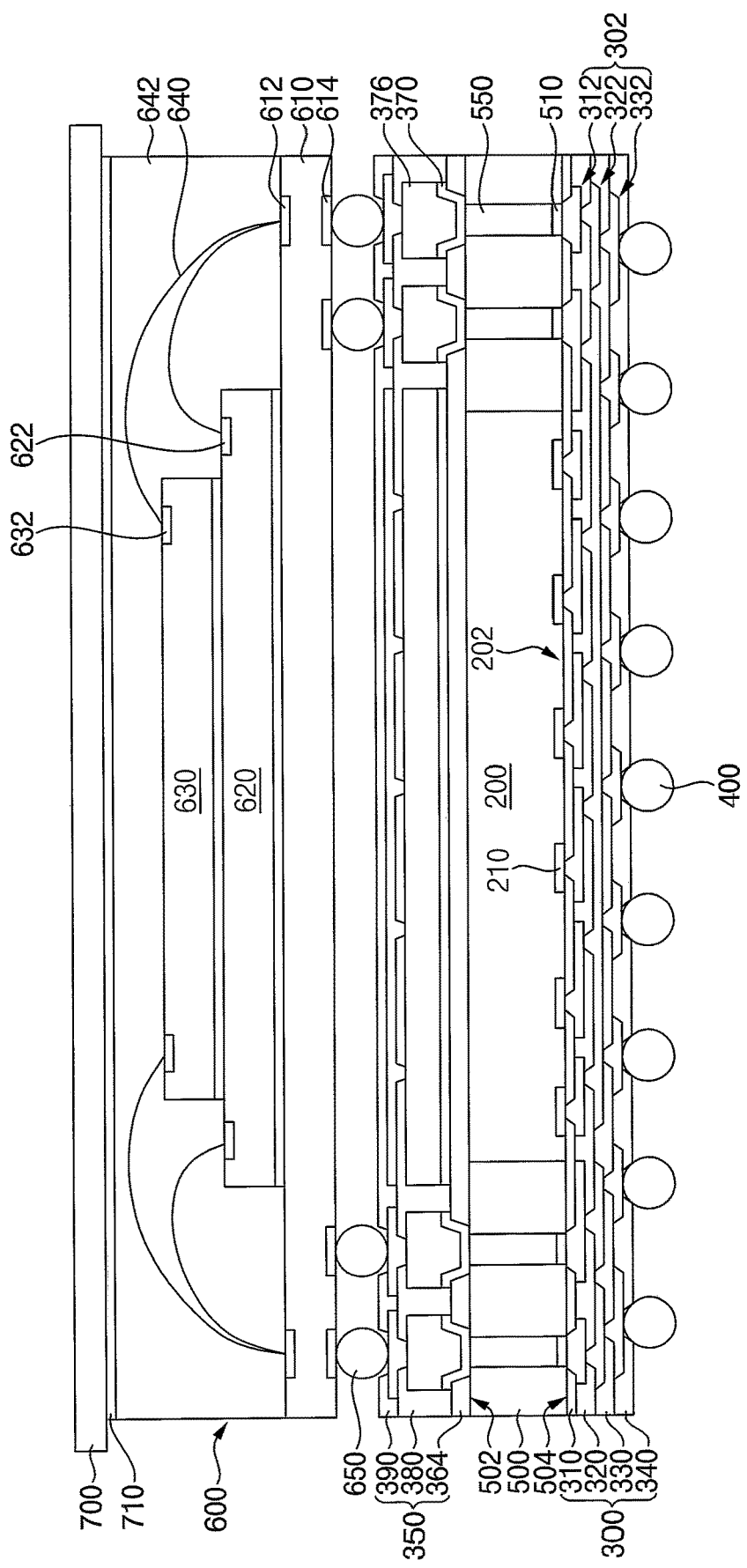

FIG. 41 is a cross-sectional view illustrating a semiconductor package in accordance with example embodiments. The semiconductor package may be substantially the same as or similar to the semiconductor package described with reference to FIG. 40 except for a mold substrate provided instead of a core substrate. Thus, same reference numerals will be used to refer to the same or like elements and any further repetitive explanation concerning the above elements will be omitted.

Referring to FIG. 41, a semiconductor package 14 may include a first package and a second package 600 stacked on the first package. The first package may include a lower redistribution wiring layer 300, at least one semiconductor chip 200 arranged on the lower redistribution wiring layer 300, a mold substrate 500 on an upper surface of the lower redistribution wiring layer 300 to cover at least a side surface of the semiconductor chip 200, and an upper redistribution wiring layer 350 arranged on an upper surface of the mold substrate 500. The first package may be substantially the same as or similar to the unit package described with reference to FIG. 32, except for conductive connection columns 550. The semiconductor package 14 may further include outer connection members 400 on a lower surface of the lower redistribution wiring layer 300 and a heat sink 700 stacked on the second package 600.

In example embodiments, the first package of the semiconductor package 14 may include the mold substrate 500 used as a support member provided in a fan out region surrounding the semiconductor chip 200. The mold substrate 500 may serve as a frame surrounding the semiconductor chip 200. The conductive connection columns 550 may be provided to penetrate at least a portion of the mold substrate 500 in a region outside the semiconductor chip 200. The conductive connection column 550 may be a mold through via (MTV) that extends from an upper surface 502 to a lower surface 504 of the mold substrate 500. For example, the conductive connection column 550 may be a vertical connection structure that penetrates the mold substrate 500.

Hereinafter, a method of manufacturing the semiconductor package in FIG. 41 will be explained.

FIGS. 42 to 51 are cross-sectional views illustrating a method of manufacturing a semiconductor package in accordance with example embodiments.

Figure 42:
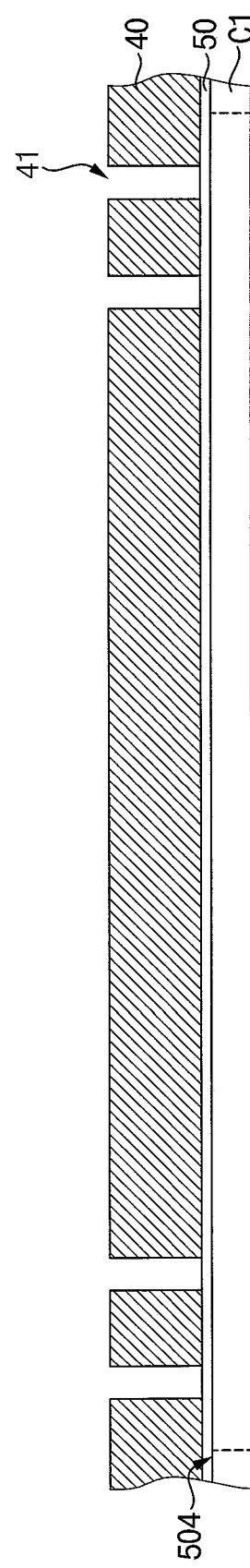

Referring to FIG. 42, a seed layer 50 and a photoresist pattern 40 having openings 41 for forming conductive connection structures may be formed on a first carrier substrate C1.

In example embodiments, the first carrier substrate C1 may include a wafer substrate. The wafer substrate may be used as a base substrate on which a plurality of semiconductor chips are arranged and a molding member is formed to cover the semiconductor chips. The wafer substrate may have a shape corresponding to a wafer on which semiconductor manufacturing processes are performed.

The wafer substrate may include a redistribution wiring region in which a lower redistribution wiring layer is formed and a scribed lane region, that is, a cutting region surrounding the redistribution wiring region. As described later, the lower redistribution wiring layer and the molding member formed on the wafer substrate may be cut along the cutting region.

For example, the seed layer 50 may be formed by a sputtering process. The seed layer 50 may include an alloy layer including titanium/copper (Ti/Cu), titanium/palladium (Ti/Pd), titanium/nickel (Ti/Ni), chrome/copper (Cr/Cu) or a combination thereof.

After forming a photoresist layer on the seed layer 50, an exposure process may be performed on the photoresist layer to form the photoresist pattern 40 having the openings 41.

Figure 43:
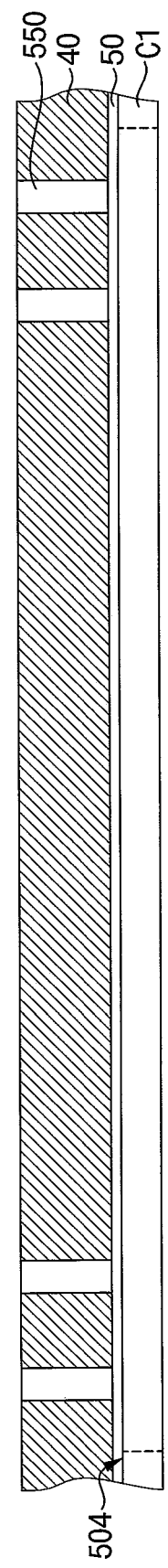
Figure 44:
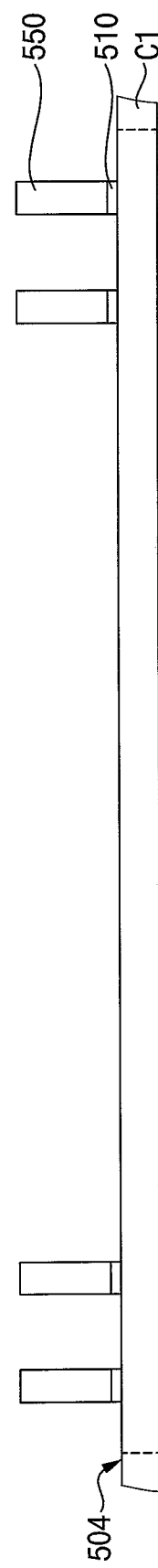

Referring to FIGS. 43 and 44, a plating process may be performed on the seed layer 50 to form conductive connection columns 550 as the conductive connection structures, the photoresist pattern may be removed, and then, the seed layer 50 under the photoresist pattern 40 may be partially etched.

Figure 45:
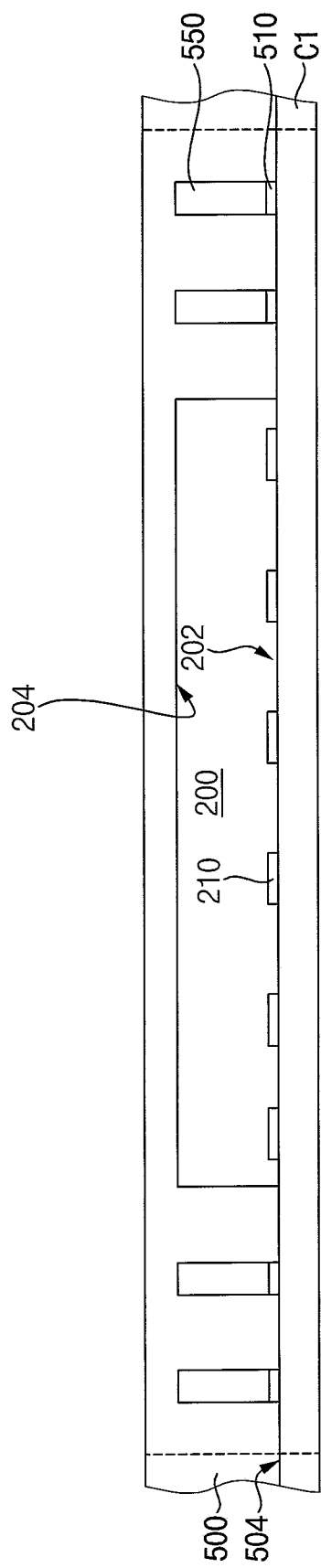

Referring to FIG. 45, a semiconductor chip 200 may be arranged on the first carrier substrate C1, and then, a mold substrate 500 may be formed to cover the semiconductor chip 200. The semiconductor chip 200 may be arranged such that a front surface on which chip pads 210 of the semiconductor chip 200 are formed faces the first carrier substrate C1. For example, a height of the semiconductor chip 200 may be less than a height of the conductive connection column 550.

The mold substrate 500 may be formed on the first carrier substrate C1 using a molding material to cover the semiconductor chip 200 and a plurality of the conductive connection columns 550. For example, the mold substrate 500 may include epoxy mold compound (EMC). The mold substrate 500 may be formed by a molding process, a screen printing process, a lamination process, etc.

Figure 46:
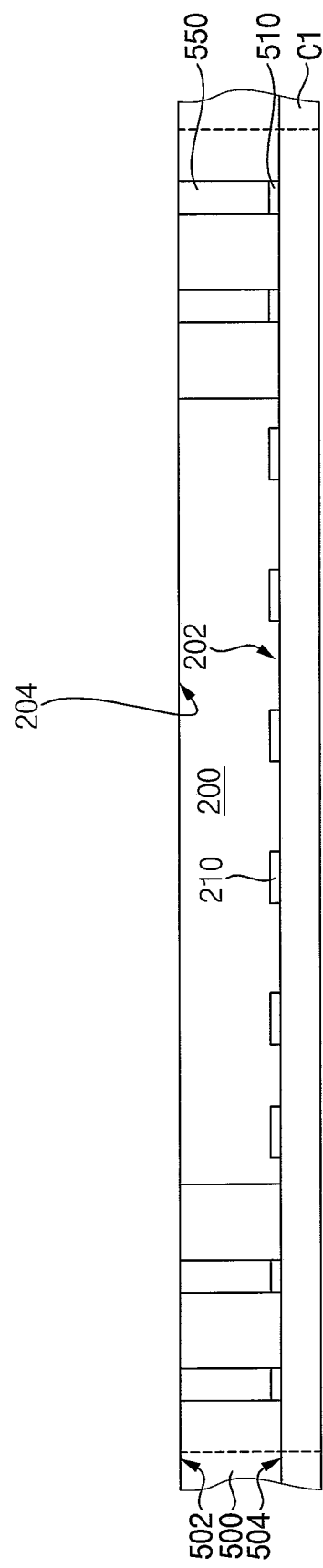

Referring to FIG. 46, an upper surface 502 of the mold substrate 500 may be planarized to expose a backside surface 204 of the semiconductor chip 200. In such planarization of the upper surface 502 of the mold substrate, upper surfaces of the conductive connection columns 550 and the backside surface 204 of the semiconductor chip 200 may be partially removed together.

The upper surface 502 of the mold substrate 500, the upper surfaces of the conductive connection columns 550 and the backside surface 204 of the semiconductor chip 200 may be planarized by a grinding process such as a chemical mechanical polishing process. Thus, the backside surface 204 of the semiconductor chip 200 may be located on the same plane as the upper surface 502 of the mold substrate 500.

Referring to FIGS. 47 to 50, processes which are the same as or similar to the processes described with reference to FIGS. 34 to 39 may be performed to form an upper redistribution wiring layer 350 on the backside surface 204 of the semiconductor chip 200 and the upper surface 502 of the mold substrate 500.

Figure 47:
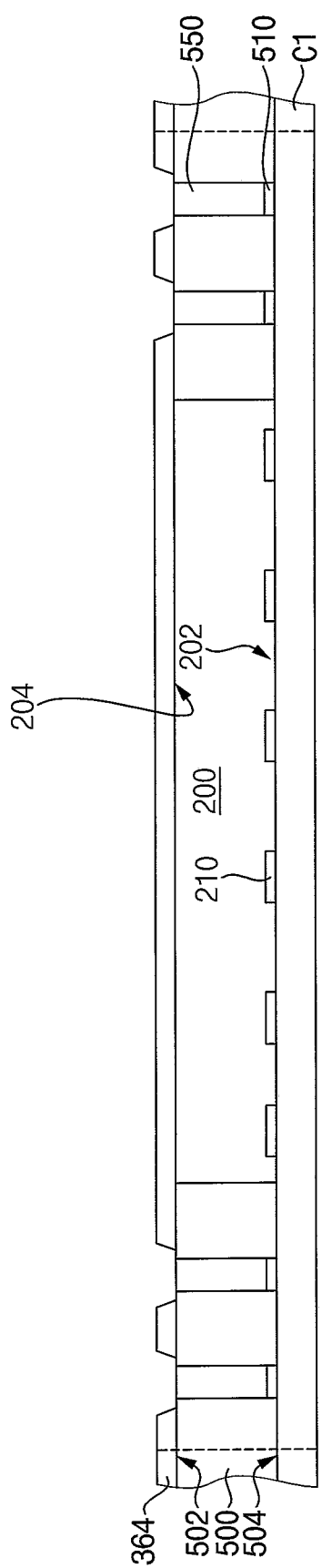

As illustrated in FIG. 47, an oxide layer 364 as a barrier layer may be formed on the backside surface 204 of the semiconductor chip 200 and the upper surface 502 of the mold substrate 500. For example, the oxide layer 364 may include silicon oxide. A thickness of the oxide layer may have a value from 0.1 μm to 0.5 μm.

Alternatively, an adhesive layer may be formed on the backside surface 204 of the semiconductor chip 200 and the upper surface 502 of the mold substrate 500 instead of the oxide layer. The adhesive layer may include an adhesive film such as a die attach film (DAF). A copper foil may be attached on the adhesive layer.

Then, the oxide layer 364 may be partially removed to form openings that expose portions of the upper surfaces of the conductive connection columns 550. For example, the openings may be formed using a laser. Examples of the laser may be $CO_2$ laser, YAG laser, excimer laser, UV laser, etc.

Figure 48:
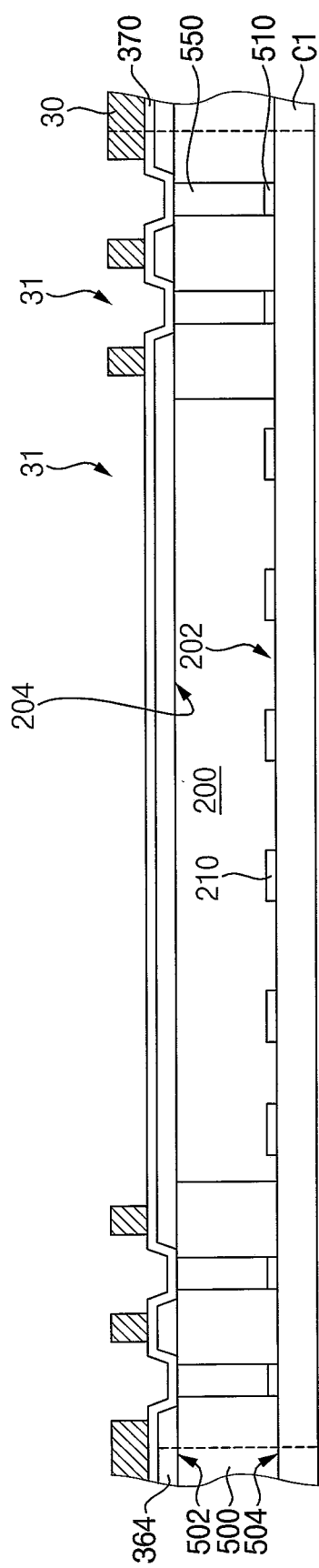

Referring to FIG. 48, a seed layer 370 may be formed on the oxide layer 362 and the upper surfaces of the conductive connection columns 550, and then, a photoresist pattern 30 having openings 31 that expose the semiconductor chip 200 and portions of the seed layer on the conductive connection columns 550 may be formed on the seed layer 370.

Figure 49:
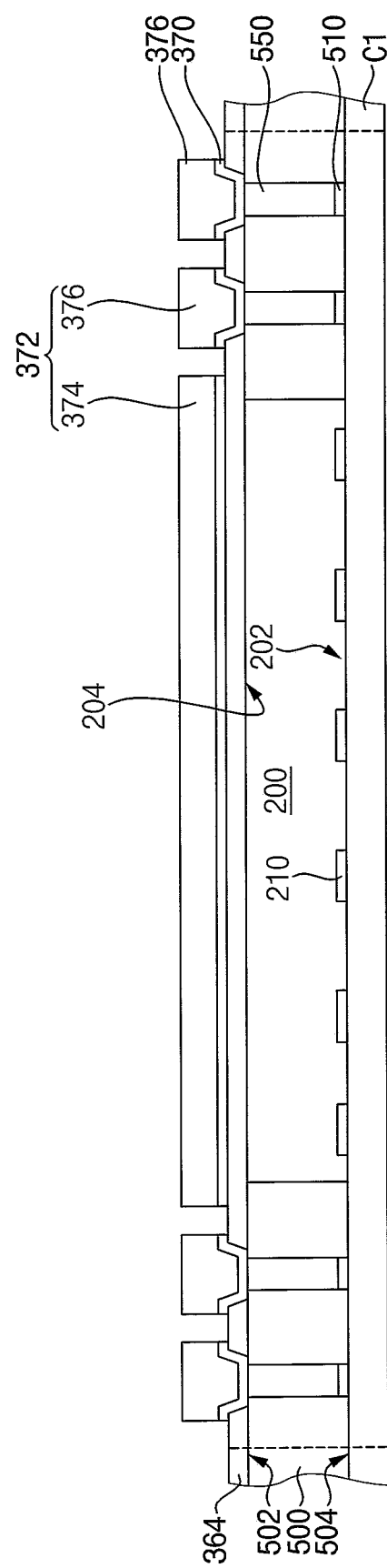

Referring to FIG. 49, a plating process may be performed on the seed layer 370 to form a first upper redistribution wiring layer including first upper metal patterns 372 including a metal material, the photoresist pattern 30 may be removed, and then, the seed layer 370 under the photoresist pattern 30 may be etched.

The first upper metal patterns 372 formed on the seed layer 370 by the plating process may include a thermal pattern 374 arranged on the backside surface 204 of the semiconductor chip 200 and first upper redistribution wirings 376 electrically connected to the conductive connection columns 550. The thermal pattern 374 may include a metal pattern covering the backside surface 204 of the semiconductor chip 200.

Figure 50:
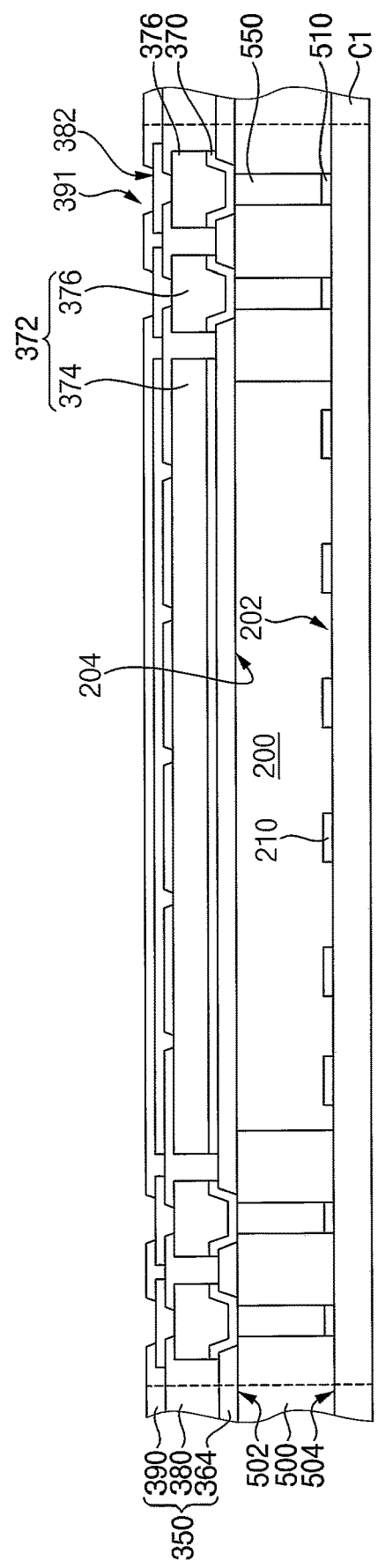

As illustrated in FIG. 50, a first upper insulation layer 380 having openings that expose the first upper metal patterns 372 may be formed, second upper metal patterns 382 may be formed on the first upper insulation layer 380, a second upper insulation layer 390 may be formed on the first upper insulation layer 380, and then, the second upper insulation layer 390 may be patterned to form seventh openings 391 that expose portions of the second upper metal patterns 382.

Figure 51:
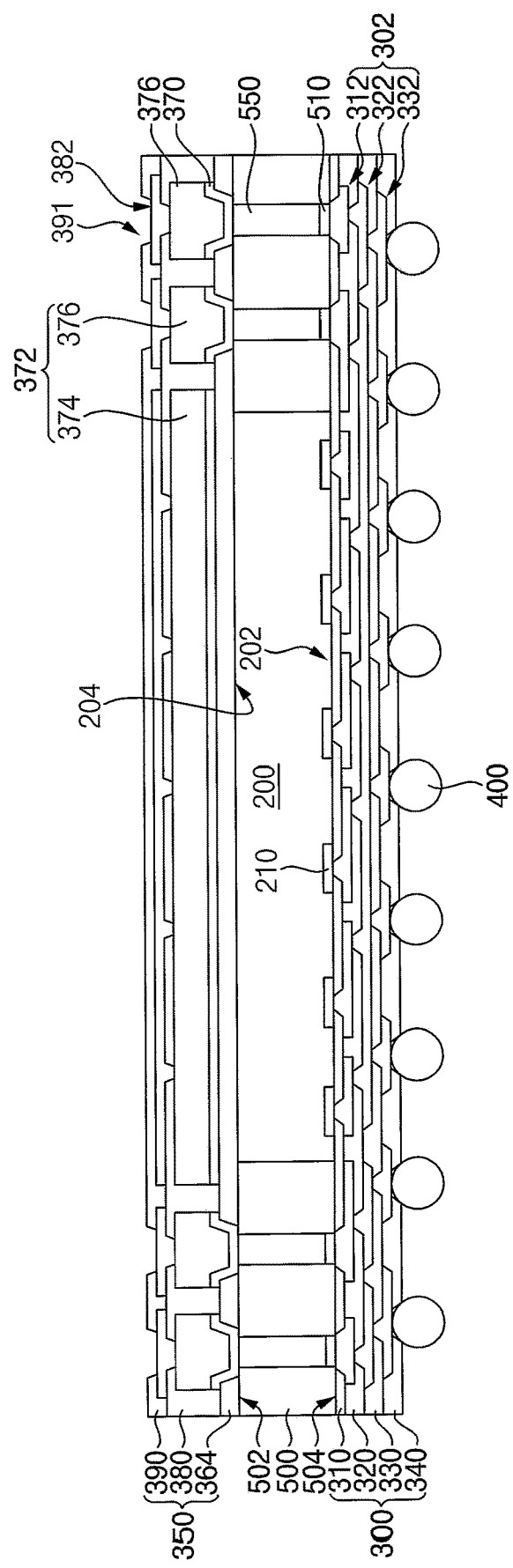

Referring to FIG. 51, processes which are the same as or similar to the processes described with reference to FIGS. 8 to 10 may be performed to form a lower redistribution wiring layer 300 on the front surface 202 of the semiconductor chip 200 and the lower surface 504 of the mold substrate 500. The lower redistribution wiring layer may include first redistribution wirings 302 electrically connected to the chip pads 210 of the semiconductor chip 200 and the conductive connection columns 550, respectively.

Then, outer connection members 400 may be formed on the lower redistribution wiring layer 300 to be electrically connected to the first redistribution wirings 302, respectively. For example, a solder ball as the outer connection member may be disposed on the portion of a third lower redistribution wiring 332. The portion of the third lower redistribution wiring 332 may serve as a landing pad, that is, a package pad.

Thus, semiconductor manufacturing processes may be performed on the wafer substrate having the same size as each die of a wafer to form the lower redistribution wiring layer 300 having fan-out type solder ball landing pads.

Then, the lower redistribution wiring layer 300 and the mold substrate 500 may be cut to form an individual semiconductor package. The lower redistribution wiring layer 300 may be cut by a sawing process to form an individual fan-out package.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
   a lower redistribution wiring layer having a plurality of first redistribution wirings;
   a semiconductor chip disposed on the lower redistribution wiring layer and having a plurality of chip pads electrically connected to the plurality of first redistribution wirings;
   a molding member on the lower redistribution wiring layer, the molding member covering the semiconductor chip, the molding member exposing a backside surface of the semiconductor chip;
   a plurality of conductive connection columns penetrating the molding member and extending from an upper surface of the lower redistribution wiring layer; and
   an upper redistribution wiring layer on an upper surface of the molding member and covering the backside surface of the semiconductor chip, and including a plurality of second redistribution wirings electrically connected to the conductive connection columns and a metallic thermal pattern provided on the exposed backside surface of the semiconductor chip.

2. The semiconductor package of claim 1, wherein the semiconductor chip is arranged on the lower redistribution wiring layer such that a front surface on which the plurality of chip pads are formed faces the lower redistribution wiring layer.

3. The semiconductor package of claim 2, wherein the front surface of the semiconductor chip is coplanar with a lower surface of the molding member.

4. The semiconductor package of claim 1, wherein the backside surface of the semiconductor chip is coplanar with the upper surface of the molding member.

5. The semiconductor package of claim 1, wherein the upper redistribution wiring layer further includes a barrier layer provided between the metallic thermal pattern and the backside surface of the semiconductor chip.

6. The semiconductor package of claim 5, wherein the barrier layer includes at least one of a seed layer, an oxide layer, and an adhesive layer.

7. The semiconductor package of claim 1, wherein the metallic thermal pattern includes a first thickness, and
wherein each of the plurality of first redistribution wirings has a second thickness less than the first thickness.

8. The semiconductor package of claim 7, wherein the first thickness of the metallic thermal pattern has a value from 3 μm to 50 μm, and
wherein the second thickness of each of the plurality of first redistribution wirings has a value from 3 μm to 8 μm.

9. The semiconductor package of claim 1, wherein the plurality of second redistribution wirings includes a first upper redistribution wiring and a second upper redistribution wiring stacked in at least two levels.

10. The semiconductor package of claim 9, wherein the upper redistribution wiring layer further includes a ground pattern coplanar with the second upper redistribution wiring and electrically connected to the metallic thermal pattern.

11. A semiconductor package, comprising:
a lower redistribution wiring layer including a plurality of first redistribution wirings;
at least one semiconductor chip including a plurality of chip pads and arranged on the lower redistribution wiring layer such that a front surface on which the plurality of chip pads are formed faces the lower redistribution wiring layer and are electrically connected to the plurality of first redistribution wirings;
a molding member on an upper surface of the lower redistribution wiring layer, the molding member covering a side surface of the semiconductor chip, the molding member exposing a backside surface of the semiconductor chip;
a plurality of conductive connection columns penetrating the molding member and extending from the upper surface of the lower redistribution wiring layer;
an upper redistribution wiring layer covering an upper surface of the molding member, and including a plurality of second redistribution wirings electrically connected to the plurality of conductive connection columns and a metallic thermal pattern provided on the exposed backside surface of the semiconductor chip; and
a plurality of outer connection members arranged on a lower surface of the lower redistribution wiring layer and electrically connected to the plurality of first redistribution wirings,
wherein the backside surface of the semiconductor chip is coplanar with the upper surface of the molding member, and
a first thickness of the metallic thermal pattern has a value from 3 μm to 50 μm.

12. The semiconductor package of claim 11, wherein the upper redistribution wiring layer further includes a barrier layer provided between the metallic thermal pattern and the backside surface of the semiconductor chip.

13. The semiconductor package of claim 12, wherein the barrier layer includes at least one of a seed layer, an oxide layer, and an adhesive layer.

14. The semiconductor package of claim 11, wherein the plurality of second redistribution wirings include a first upper redistribution wiring and a second upper redistribution wiring stacked in two levels, and
wherein the metallic thermal pattern is coplanar with the first upper redistribution wiring.

15. The semiconductor package of claim 14, wherein the upper redistribution wiring layer further includes a ground pattern electrically connected to the metallic thermal pattern.

16. A semiconductor package, comprising:
a lower redistribution wiring layer including a plurality of first redistribution wirings;
a semiconductor chip arranged on the lower redistribution wiring layer, and having a plurality of chip pads provided at a front surface to be electrically connected to the plurality of first redistribution wirings;
a molding member on the lower redistribution wiring layer to surround the semiconductor chip, and exposing a backside surface of the semiconductor chip, the molding member including a plurality of vertical connection structures that penetrate at least a portion of the molding member;
a barrier layer provided on the exposed backside surface of the semiconductor chip; and
an upper redistribution wiring layer on the molding member, and including a plurality of second redistribution wirings electrically connected to the plurality of vertical connection structures, and a metallic thermal pattern provided on the barrier layer.

17. The semiconductor package of claim 16, wherein the barrier layer includes at least one of a seed layer, an oxide layer, and an adhesive layer.

18. The semiconductor package of claim 17, wherein a thickness of the metallic thermal pattern has a value from 3 μm to 50 μm.

19. The semiconductor package of claim 16, wherein the plurality of second redistribution wirings include a first upper redistribution wiring and a second upper redistribution wiring stacked in at least two levels, and
wherein the metallic thermal pattern is coplanar with the first upper redistribution wiring.

20. The semiconductor package of claim 19, wherein the upper redistribution wiring layer further includes a ground pattern coplanar with the second upper redistribution wiring and electrically connected to the metallic thermal pattern.

* * * * *